US012641897B2

(12) United States Patent
Shigei et al.

(10) Patent No.: US 12,641,897 B2
(45) Date of Patent: May 26, 2026

(54) LIGHT DETECTION DEVICE WITH PINHOLE BODY

(71) Applicant: SONY GROUP CORPORATION, Tokyo (JP)

(72) Inventors: Hiroyuki Shigei, Tokyo (JP); Toru Amano, Tokyo (JP); Yasunori Kamada, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 617 days.

(21) Appl. No.: 17/999,070

(22) PCT Filed: May 7, 2021

(86) PCT No.: PCT/JP2021/017493
§ 371 (c)(1),
(2) Date: Nov. 17, 2022

(87) PCT Pub. No.: WO2021/241165
PCT Pub. Date: Dec. 2, 2021

(65) Prior Publication Data
US 2023/0246049 A1 Aug. 3, 2023

(30) Foreign Application Priority Data

May 27, 2020 (JP) ................................. 2020-092717

(51) Int. Cl.
*H10F 39/00* (2025.01)
*G06V 40/13* (2022.01)
(Continued)

(52) U.S. Cl.
CPC ....... *H10F 39/806* (2025.01); *G06V 40/1318* (2022.01); *H10F 39/198* (2025.01); *H10K 59/65* (2023.02)

(58) Field of Classification Search
CPC . H10F 39/806; H10F 39/198; G06V 40/1318; H10K 59/65
See application file for complete search history.

(56) References Cited

U.S. PATENT DOCUMENTS

2004/0129992 A1* 7/2004 Shibayama ............. H10F 39/18
257/443
2018/0205866 A1 7/2018 Komai
2019/0101657 A1 4/2019 Shahar

FOREIGN PATENT DOCUMENTS

CN 109069086 A 12/2018
CN 110536049 A 12/2019
(Continued)

OTHER PUBLICATIONS

International Search Report and Written Opinion of PCT Application No. PCT/JP2021/017493, issued on Jul. 13, 2021, 10 pages of ISRWO.

(Continued)

*Primary Examiner* — Suberr L Chi
(74) *Attorney, Agent, or Firm* — CHIP LAW GROUP

(57) ABSTRACT

A light detection device that includes a pinhole body provided with a through hole (H), and an optical sensor that is provided behind the pinhole body and receives light transmitted through the through hole (H), in which a first aperture (O1) of the through hole (H) arranged on a first surface being a light incident surface side of the pinhole body is smaller than a second aperture (O2) of the through hole (H) arranged on a second surface opposite to the first surface.

14 Claims, 17 Drawing Sheets

(51) Int. Cl.
  *H10F 39/12*     (2025.01)
  *H10K 59/65*     (2023.01)

(56)           References Cited

FOREIGN PATENT DOCUMENTS

| | | | |
|---|---|---|---|
| EP | 3446631 | A1 | 2/2019 |
| EP | 3751620 | A1 | 12/2020 |
| EP | 3798804 | A1 | 3/2021 |
| JP | 10-065132 | A | 3/1998 |
| JP | 11-306332 | A | 11/1999 |
| JP | 2002062581 | A | 2/2002 |
| JP | 2012-185228 | A | 9/2012 |
| JP | 2016-025164 | A | 2/2016 |
| WO | 2017/022450 | A1 | 2/2017 |
| WO | 2019/133177 | A1 | 7/2019 |
| WO | 2019/207923 | A1 | 10/2019 |

OTHER PUBLICATIONS

Karel Deprez et al: "Characterization of a SPECT pinhole collimator for optimal detector usage (the lofthole)", Physics in Medicine and Biology, Institute of Physics Publishing, Bristol GB, vol. 58, No. 4, Jan. 21, 2013 (Jan. 21, 2013), pp. 859-885, XP020237420, ISSN: 0031-9155, DOI:10.1088/0031-9155/58/4/859* abstract; figures 4, 6-7, 11-15, 20 ** p. 860-p. 870*.

* cited by examiner

LIGHT DETECTION DEVICE WITH PINHOLE BODY

CROSS REFERENCE TO RELATED APPLICATIONS

This application is a U.S. National Phase of International Patent Application No. PCT/JP2021/017493 filed on May 7, 2021, which claims priority benefit of Japanese Patent Application No. JP 2020-092717 filed in the Japan Patent Office on May 27, 2020. Each of the above-referenced applications is hereby incorporated herein by reference in its entirety.

FIELD

The present disclosure relates to a light detection device.

BACKGROUND

An imaging device that performs imaging using a pinhole is known (refer to Patent Literature 1, for example).

CITATION LIST

Patent Literature

Patent Literature 1: JP 2016-25164 A

SUMMARY

Technical Problem

In order to obtain a high angle of view with the pinhole, it is conceivable to reduce the depth of the pinhole This, however, would thin a portion constituting the pinhole, leading to impairment of sense of quality.

The present disclosure, in one aspect, aims to provide a light detection device capable of suppressing impairment of sense of quality in a portion constituting a pinhole.

Solution to Problem

A light detection device according to one aspect of the present disclosure includes: a pinhole body provided with a through hole; and an optical sensor that is provided behind the pinhole body and receives light transmitted through the through hole, wherein a first aperture of the through hole is smaller than a second aperture of the through hole, the first aperture being provided in a first surface of the pinhole body, the first surface being a surface on an incident surface side of the light, the second aperture being provided in a second surface of the pinhole body, the second surface being a surface opposite to the first surface.

DESCRIPTION OF EMBODIMENTS

Figure 1:
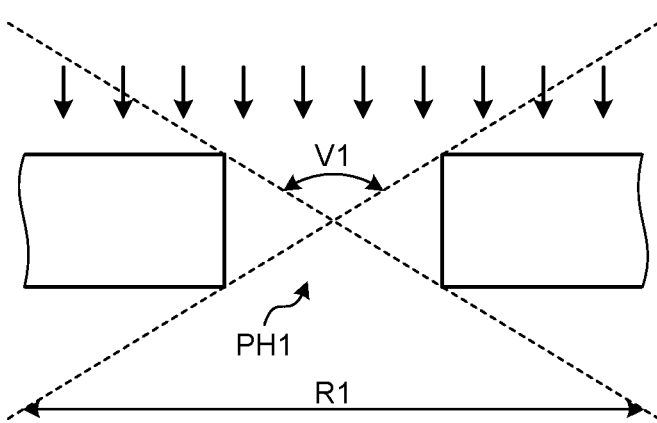
FIG. 1 is a conceptual view illustrating light detection using a pinhole.

Embodiments of the present disclosure will be described below in detail with reference to the drawings. In each of the following embodiments, the same parts are denoted by the same reference numerals, and a repetitive description thereof will be omitted.

The present disclosure will be described in the following order.

1. Introduction
2. Embodiments
2.1 Example of cross-sectional shape of pinhole body
2.2 Arrangement example of plurality of through holes having different aperture areas.
2.3 Example of pinhole array
2.4 Example of photodiode sensor
2.5 Example of mounting on display
2.6 Example of fingerprint sensor
3. Application Examples 4. Effects
5. Example of application to moving object
6. Example of application to endoscopic surgery system

1. INTRODUCTION

Figure 2:
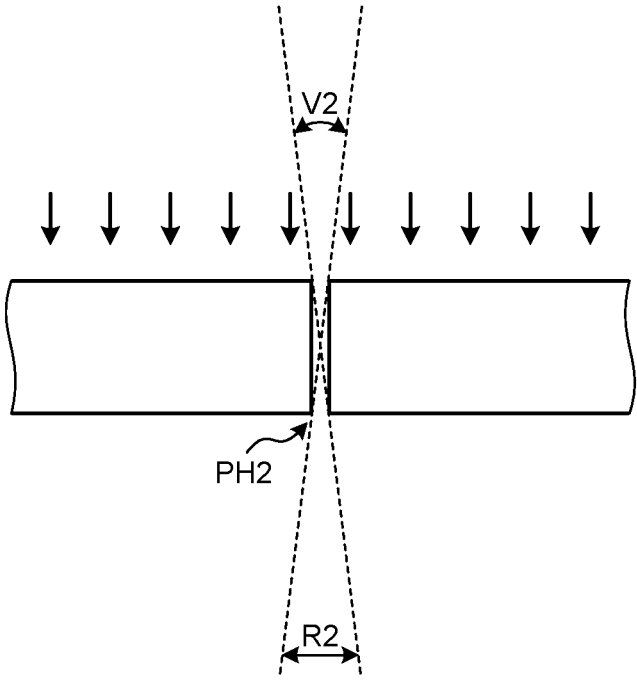
FIG. 2 is a conceptual view illustrating light detection using a pinhole.

FIGS. 1 and 2 are diagrams conceptually illustrating light detection by pinholes. FIGS. 1 and 2 illustrate two types of pinholes PH1 and PH2 having different aperture areas. Solid arrows extending downward from the top in the drawing conceptually indicate beams of light traveling toward the pinhole PH1 and the pinhole PH2.

In the example illustrated in FIGS. 1 and 2, the pinhole PH1 and the pinhole PH2 have the same depth and mutually different aperture areas. The aperture area of the pinhole PH2 is smaller than the aperture area of the pinhole PH1. Accordingly, an angle of view V2 corresponding to the pinhole PH2 is smaller than an angle of view V1 corresponding to the pinhole PH1. An image forming range R2 of the pinhole PH2 is smaller (narrower) than an image forming range R1 of the pinhole PH1. In this manner, by using a pinhole having a small aperture area, it is possible to improve definition, modulation transfer function (MTF), and the like (hereinafter, simply referred to as "definition, etc."). When the aperture areas of the pinholes are the same, definition, etc. is improved by using a pinhole having a large depth.

For example, in order to increase the angle of view while maintaining the definition and the like, it is necessary to reduce the depth of the pinhole. In order to thin the portion where the pinhole is formed, there would be a need to use a very thin film-like material, and this would impair a sense of quality. It is desirable to maintain the angle of view and/or the definition, etc. while suppressing the impairment of sense of quality.

2. EMBODIMENTS

Figure 3:
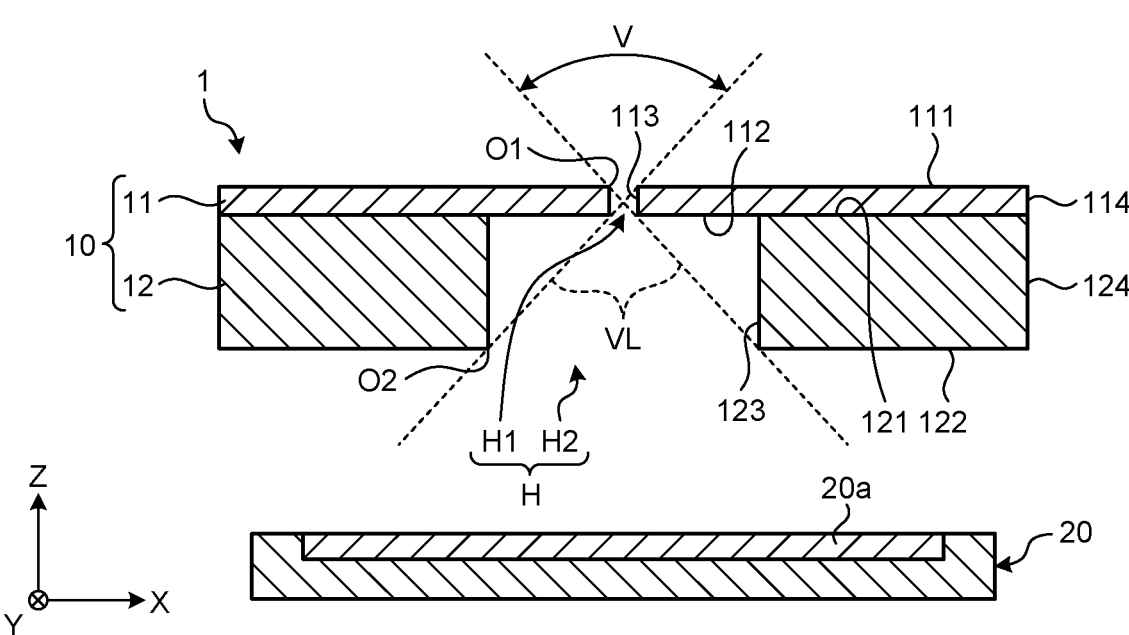
FIG. 3 is a diagram illustrating an example of a schematic configuration of a light detection device according to an embodiment.

FIG. 3 is a diagram illustrating an example of a schematic configuration of a light detection device according to an embodiment. In the figure, an XYZ coordinate system is illustrated. The Z-axis direction corresponds to the depth (front-rear) direction of the light detection device. The X-axis direction and the Y-axis direction respectively correspond to horizontal (right-left) and vertical (up-down) directions of the light detection device. A detection target of the light detection device is assumed to exist in front of the light detection device (on the Z-axis positive direction side).

FIG. 3 is a cross-sectional view of the light detection device 1 when viewed from a direction (in this example, the Y-axis direction) intersecting the Z-axis direction. The light detection device 1 includes: a pinhole body 10; and an optical sensor 20 provided behind (on the Z-axis negative direction side of) the pinhole body 10.

The pinhole body 10 is provided with a through hole H. The through hole H is a hole (pinhole) penetrating the pinhole body 10 in the Z-axis direction. For convenience of description, the through hole H is illustrated as two holes, namely, a first hole H1 and a second hole H2. A portion of the pinhole body 10 corresponding to the first hole H1 is referred to as a surface portion 11 in the drawing. A portion of the pinhole body 10 corresponding to the second hole H2 is referred to as a base portion 12 in the drawing. The surface portion 11 and the base portion 12 may be formed as separately molded portions or an integrally molded portion.

The surface portion 11 has a front surface 111, a back surface 112, an inner side surface 113, and an outer side surface 114.

The front surface 111 and the back surface 112 extend in an XY plane direction and face each other in the Z-axis direction. The front surface 111 constitutes a first surface which is a light incident surface side of the pinhole body 10. A first aperture O1 of the through hole H disposed in the front surface 111 is smaller than a second aperture O2 of the through hole H disposed in a second surface (a back surface 122 to be described below) opposite to the front surface 111. The back surface 112 is a surface opposite to the front surface 111 in the surface portion 11.

The inner side surface 113 and the outer side surface 114 extend in the Z-axis direction and face each other in the X-axis direction (or the Y-axis direction). The inner side surface 113 forms the first hole H1 of the through hole H. When viewed in the direction intersecting the Z-axis direction (in this example, the Y-axis direction), a separation distance between the inner side surfaces 113 facing each other across the first hole H1 is constant in a depth direction. The first hole H1 has a cross-sectional shape having a constant aperture area in the depth direction. The inner side surface 113 may have a light absorbing surface. With this configuration, light reflection in the first hole H1 is suppressed, leading to reduction of noise (stray light or the like) caused by reflected light. The light absorbing surface may be formed by performing application, plating, etching, or the like, of a light absorbing material (for example, black paint) to a portion corresponding to the inner side surface 113 of the surface portion 11. Light absorption processing may be performed instead of applying the light absorbing material or the like. The outer side surface 114 is a surface opposite to the inner side surface 113 in the surface portion 11, and constitutes a part of the outer side surface of the pinhole body 10.

The base portion 12 has a back surface 122, an inner side surface 123, and an outer side surface 124. In a case where the base portion 12 is formed separately from the surface portion 11, the base portion also has a front surface 121. Hereinafter, this case will be described.

The front surface 121 and the back surface 122 extend in the XY plane direction and face each other in the Z-axis direction. The front surface 121 is a front-side surface of the base portion 12 and faces the back surface 112 of the surface portion 11. The back surface 122 is a surface of the base portion 12 opposite to the front surface 121. The back surface 122 constitutes a second surface opposite to a front surface 111 (first surface) of the pinhole body 10. The back surface 122 faces the optical sensor 20. The back surface 122 may have a light absorbing surface. With this configuration, light reflection on the back surface 122 is suppressed, leading to reduction of noise caused by reflected light. The light absorbing surface may be similar to the light absorbing surface of the inner side surface 113 described above. The second aperture O2 of the through hole H provided on the back surface 122 is larger than the first aperture O1 of the through hole H provided on the front surface 111.

The inner side surface 123 and the outer side surface 124 extend in the Z-axis direction and face each other in the X-axis direction (or the Y-axis direction). The inner side surface 123 forms the second hole H2 of the through hole H. The depth of the second hole H2 from the back surface 122 is greater than the depth of the first hole H1 from the front surface 111. When viewed in the direction intersecting the Z-axis direction (in this example, the Y-axis direction), the separation distance between the inner side surfaces 123 facing each other across the second hole H2 is constant in the depth direction. The second hole H2 has an aperture area larger than the aperture area of the first hole H1 at the boundary between the first hole H1 and the second hole H2, and has a cross-sectional shape (cylindrical shape) in which the aperture area is constant in the depth direction of the second hole H2. The inner side surface 123 may have a light absorbing surface. With this configuration, light reflection in the second hole H2 is suppressed, leading to reduction of noise caused by reflected light. The light absorbing surface may be similar to the inner side surface 113 described above.

An angle of view corresponding to the first hole H1 is referred to as an angle of view V in the drawing. In FIG. 3, a line indicating the angle of view V is referred to as an angle of view line VL. The angle of view line VL is a virtual straight line passing through the front end of the one inner side surface 113 and the rear end of the other inner side surface 113 facing each other with the first hole H1 interposed therebetween. The second hole H2 may have a size that does not interfere with image formation by the first hole H1. In this case, the inner side surface 123 forming the second hole H2 is positioned outside the angle of view line VL. That is, the angle of view V corresponding to the first hole H1 is not to be narrowed by the second hole H2.

The optical sensor 20 receives light passing through the through hole H. The optical sensor 20 is provided behind the pinhole body 10. The optical sensor 20 has a light receiving surface 20a. The light receiving surface 20a extends in the XY plane direction and faces the back surface 112 and the back surface 122 of the pinhole body 10 in the Z-axis direction. The light receiving surface 20a is formed to receive light within the angle of view V. The area of the light receiving surface 20a may be larger than the aperture area of the second hole H2. With this dimension, even when the optical sensor 20 is provided separated from the pinhole body 10 in particular, the light within the angle of view V can be received by the light receiving surface 20a.

Figure 4:
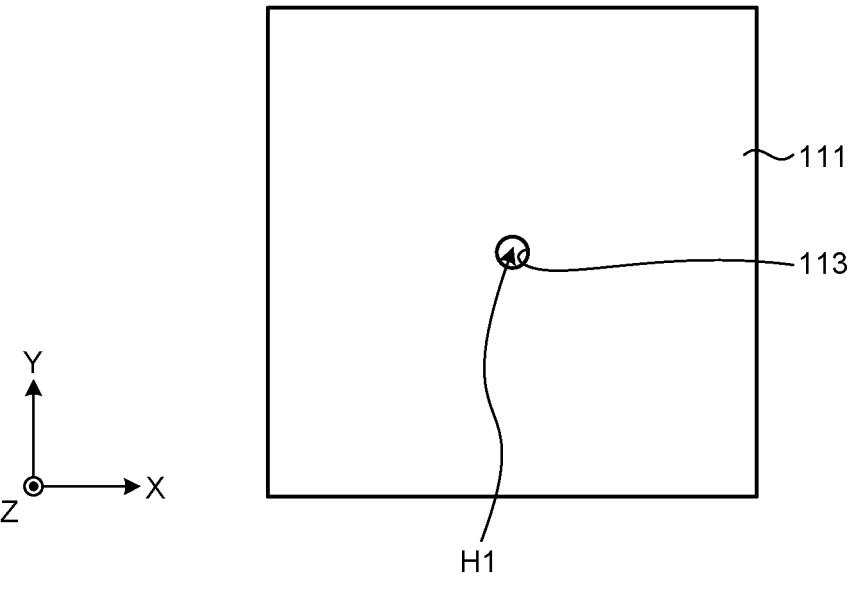
FIG. 4 is a front view illustrating an example of an appearance of a pinhole body.

FIG. 4 is a front view illustrating an example of an appearance of a schematic configuration of the pinhole body. In this example, the aperture of the first hole H1 has a circular shape. When viewed from the front, the front surface 111 of the surface portion 11 of the pinhole body 10 occupies most of the pinhole body 10. This portion is a portion that is often observed or touched by the user of the light detection device 1 (that is, regarded as an indicator of the sense of quality of the pinhole body 10 by the user). Therefore, the front surface 111 of the surface portion 11 has a large effect on the sense of quality of the pinhole body 10. This sense of quality comes from the material, the thickness (the length in the Z-axis direction), and the like of the surface portion 11 and the base portion 12 provided on the back side of the surface portion 11 (that is, the entire pinhole body 10). Examples of the material are metals such as stainless steel and aluminum. However, the material is not limited thereto, and various materials may be used. The greater the thickness of pinhole body 10, the higher the sense of quality is likely to be obtained. The smaller the thickness of the pinhole body 10, the more likely the sense of quality is to be impaired.

Figure 5:
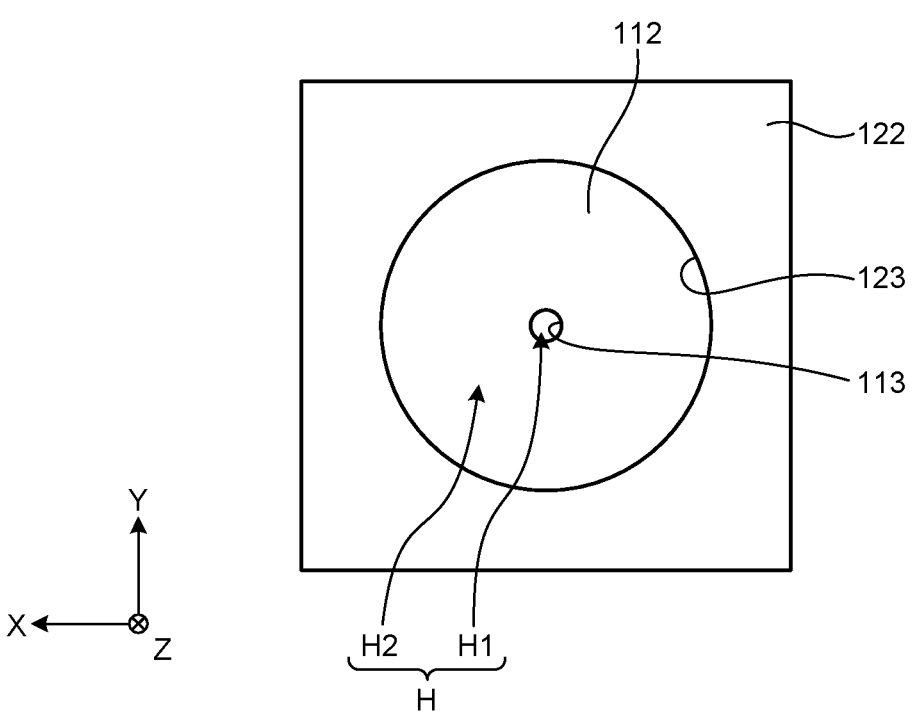
FIG. 5 is a front view illustrating an example of an appearance of a pinhole body.

FIG. 5 is a rear view illustrating an example of an appearance of a schematic configuration of the pinhole body. In this example, the aperture of the second hole H2 has a circular shape. When viewed from the rear, the back surface 112 of the surface portion 11 of the pinhole body 10 and the back surface 122 of the base portion 12 occupy most of the pinhole body 10.

In the light detection device 1 described above, the first aperture O1 having a small aperture area, among the first aperture O1 and the second aperture O2 (the first hole H1 and the second hole H2), functions as an aperture of the pinhole. Since the second aperture O2 has an aperture area larger than that of the first aperture O1, the second aperture O2 does not interfere with the pinhole function of the first aperture O1. In the presence of not only the portion corresponding to the first aperture O1 (surface portion 11) but also the portion corresponding to the second aperture O2 (base portion 12), the thickness of the pinhole body 10 is easily maintained (or easily increased). The angle of view V can be increased by thinning the portion (surface portion 11) corresponding to the first aperture O1. Even in this case, since the thickness of pinhole body 10 is maintained, the sense of quality would not be impaired. This configuration also maintains the strength. For example, if there is a partially thin portion in the pinhole body 10, the sense of quality might be deteriorated at the time of processing such as hairline processing. However, this configuration can also suppress such deterioration in the sense of quality.

The pinhole body 10 capable of having the sense of quality has a thickness of 300 μm or more, for example. Such a pinhole body 10 can be manufactured as follows, for example. First, six plate members each having a thickness of 50 μm are prepared. One of the plate members is processed to have the first hole H1 (for example, a diameter of 50 μm or the like) so as to be used as the surface portion 11. The remaining five plate members are processed to have the second hole H2 (for example, a diameter of 250 μm or a diameter of 700 μm) so as to be used as the base portion 12. These plate members are bonded to each other by diffusion bonding or the like, so as to obtain the pinhole body 10. Such a pinhole body 10 may be a stacked body having a structure with stacked layers. In the above-described example, the surface portion 11 has a single layer structure (corresponding to one plate member), while the base portion 12 has a multilayer structure (corresponding to five plate members).

2.1 Example of Cross-Sectional Shape of Pinhole Body

The second hole of the pinhole body may have various cross-sectional shapes other than the cross-sectional shape illustrated in FIG. 3 described above. Some examples of the cross-sectional shape of the pinhole body will be described with reference to FIGS. 6 to 10.

Figure 6:
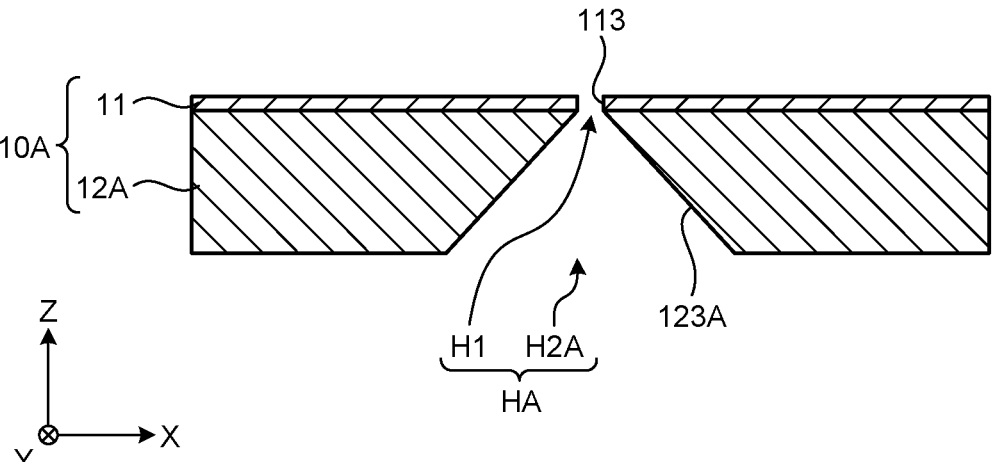
FIG. 6 is a view illustrating an example of a cross-sectional shape of a pinhole body.

A through hole HA of a pinhole body 10A illustrated in FIG. 6 has a second hole H2A. The second hole H2A has a tapered cross-sectional shape in which the aperture area increases at a constant rate toward deeper portions in the depth direction. The base portion 12A of the pinhole body 10 has an inner side surface 123A forming the second hole H2A. The separation distance between the inner side surfaces 123A facing each other across the second hole H2A increases toward deeper portions in the depth direction of the second hole H2A. The second hole H2A has the same aperture area as the aperture area of the first hole H1 at the boundary between the first hole H1 and the second hole H2A, and has a cross-sectional shape (tapered shape) in which the aperture area increases at a constant rate toward deeper portions in the depth direction of the second hole H2A.

Figure 7:
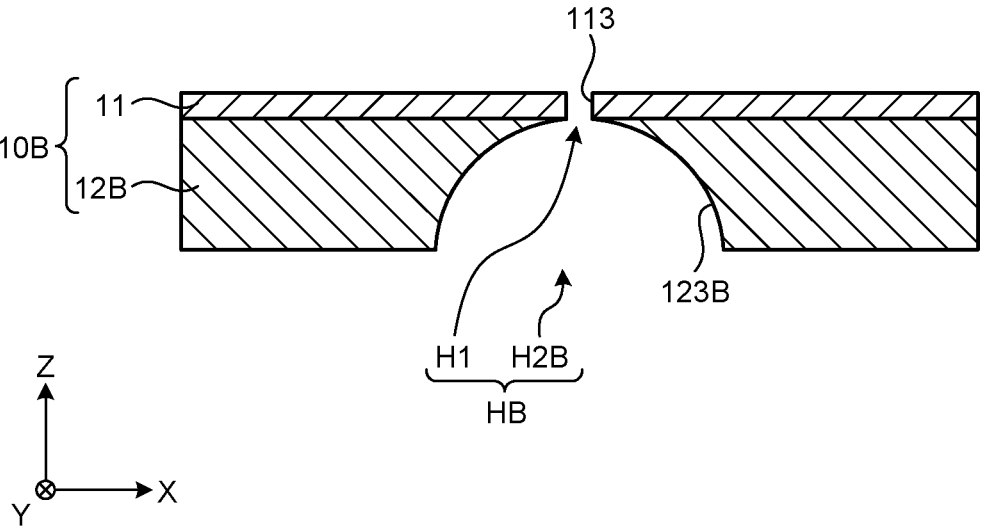
FIG. 7 is a view illustrating an example of a cross-sectional shape of a pinhole body.

A through hole HB of a pinhole body 10B illustrated in FIG. 7 has a second hole H2B. The second hole H2B has a cross-sectional shape in which the aperture area increases at a different rate toward deeper portions in the depth direction. The base portion 12B of the pinhole body 10B has an inner side surface 123B forming the second hole H2B. The separation distance between the inner side surfaces 123B facing each other across the second hole H2B increases toward deeper portions in the depth direction of the second hole H2B. The second hole H2B has the same aperture area as the aperture area of the first hole H1 at the boundary between the first hole H1 and the second hole H2B, and has a cross-sectional shape (funnel shape curved to bulge downward) that increases from the boundary toward deeper portions in the depth direction of the second hole H2B (at a gradually decreasing change rate). The cross-sectional shape of the second hole H2B may be a funnel shape curved so as to bulge upward.

Figure 8:
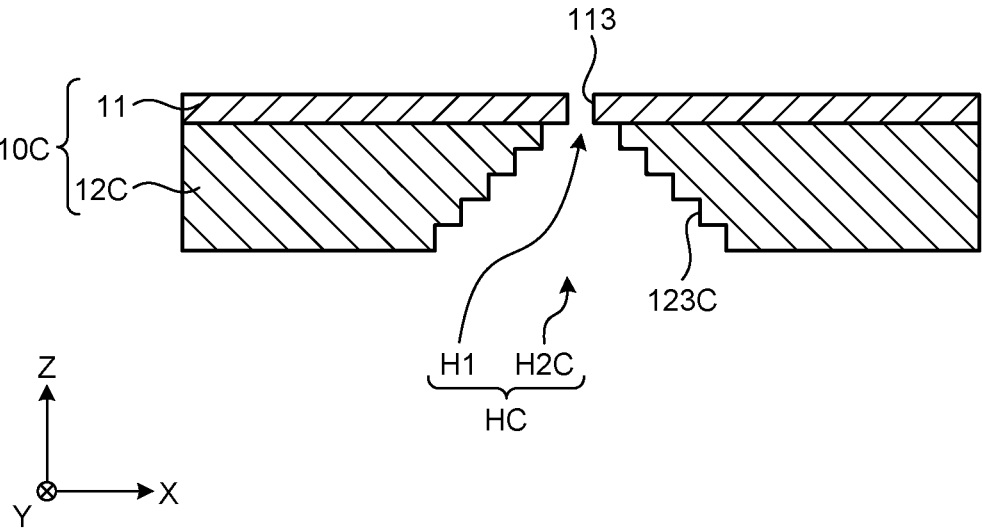
FIG. 8 is a view illustrating an example of a cross-sectional shape of a pinhole body.

A through hole HC of a pinhole body 10C illustrated in FIG. 8 has a second hole H2C. The second hole H2C has a cross-sectional shape in which the aperture area increases stepwise toward deeper portions in the depth direction. A base portion 12C of the pinhole body 10C has an inner side surface 123C forming the second hole H2C. The separation distance between the inner side surfaces 123C facing each other across the second hole H2C increases stepwise toward deeper portions in the depth direction of the second hole H2C. The second hole H2C has an aperture area that is one step larger than the aperture area of the first hole H1 at the boundary between the first hole H1 and the second hole H2C, and has a cross-sectional shape (staircase shape) that further increases stepwise toward deeper portions in the depth direction of the second hole H2C.

Figure 9:
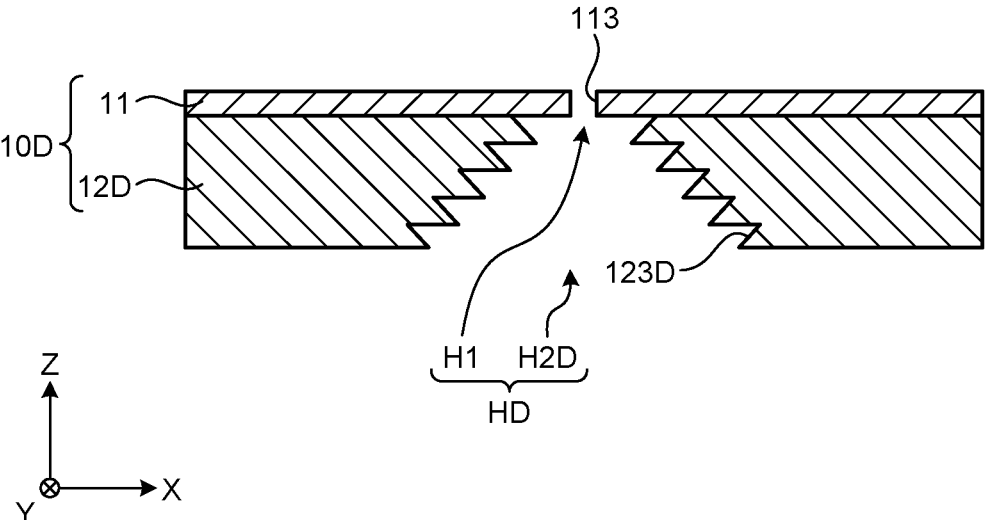
FIG. 9 is a view illustrating an example of a cross-sectional shape of a pinhole body.

A through hole HD of a pinhole body 10D illustrated in FIG. 9 has a second hole H2D. The second hole H2D has a cross-sectional shape in which the aperture area increases stepwise toward deeper portions in the depth direction. A base portion 12D of the pinhole body 10D has an inner side surface 123D forming the second hole H2D. The separation distance between the inner side surfaces 123D facing each other across the second hole H2D increases stepwise while alternating reduction and expansion toward deeper portions in the depth direction of the second hole H2D. The second hole H2D has an aperture area that is one step larger than the aperture area of the first hole H1 at the boundary between the first hole H1 and the second hole H2D, and has a shape (wedge shape) that further increases stepwise while alternating reduction and expansion toward deeper portions in the depth direction of the second hole H2D.

Figure 10:
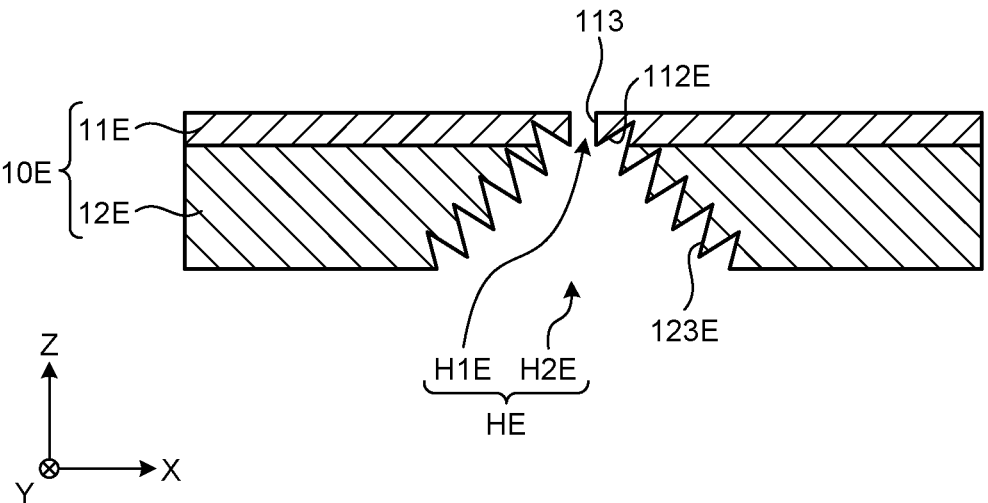
FIG. 10 is a view illustrating an example of a cross-sectional shape of a pinhole body.

A through hole HE of a pinhole body 10E illustrated in FIG. 10 has a second hole H2E. The second hole H2E has a cross-sectional shape in which the aperture area increases stepwise toward deeper portions in the depth direction. An inner side surface 123E of a base portion 12E of a pinhole body 10E is further recessed in a direction away from the optical sensor 20 (Z-axis positive direction) as compared with the inner surface 123D (FIG. 9). A part of a back surface 112E of a surface portion 11E of the pinhole body 10E is recessed in a direction away from the optical sensor 20 (Z-axis positive direction) so as to form a part of the second hole H2E. The second hole H2E has an aperture area that is one step larger than the aperture area of the first hole H1 at the boundary between the first hole H1 and the second hole H2E, and has a shape (inclined wedge shape) that further increases stepwise toward deeper portions in the depth direction of the second hole H2E.

As described with reference to FIGS. 6 to 10, with a configuration in which the aperture area of the second hole substantially increases (including increasing stepwise in addition to increasing monotonically) toward deeper portions in the depth direction, it is possible to suppress a phenomenon that the light reflected by the light receiving surface 20a of the optical sensor 20 will be reflected again in the second hole and return to the light receiving surface 20a. The second holes H2A to H2E are obtained, for example, by preparing a plate-like (thin film-like) material to be a base material of the base portions 12A to 12E and processing the material into a desired shape by machining. Examples of the machining method include cutting and laser machining. The shapes of the first hole H1A to the first hole H1E and the second hole H2A to the second hole H2E may be manufactured by the imprint fabrication. At this time, a plurality of molds may be used. The surface portion 11A to the surface portion 11E and the base portion 12A to the base portion 12E may be grown by performing plating or the like on the shape formed by the imprint fabrication.

Figure 11:
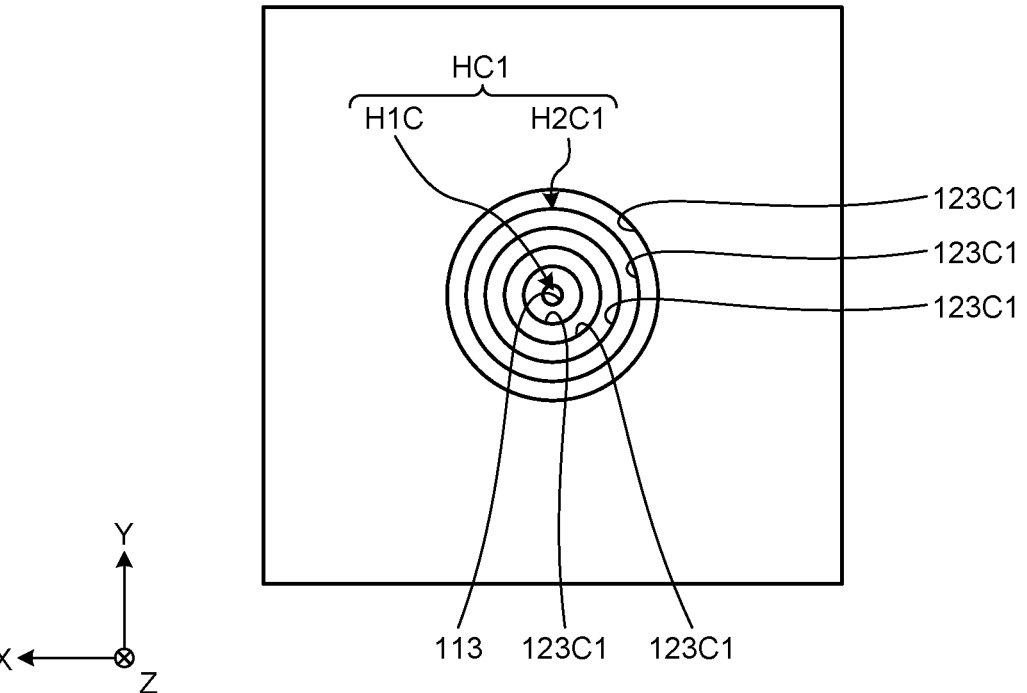
FIG. 11 is a view illustrating an example of an aperture shape of a pinhole body.
Figure 12:
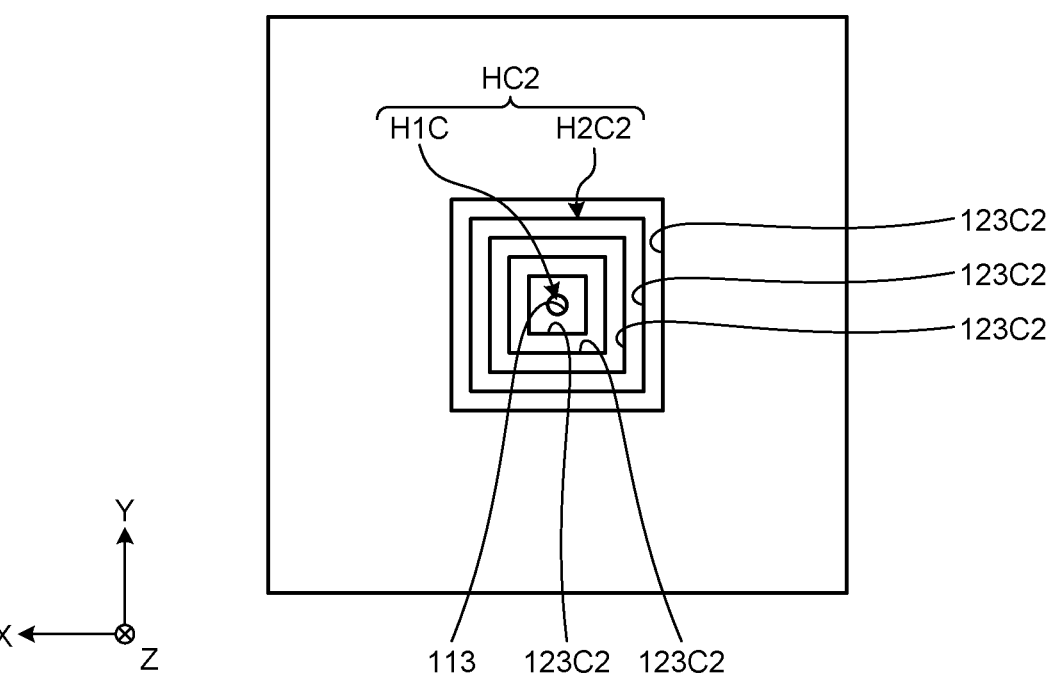
FIG. 12 is a view illustrating an example of an aperture shape of a pinhole body.
Figure 13:
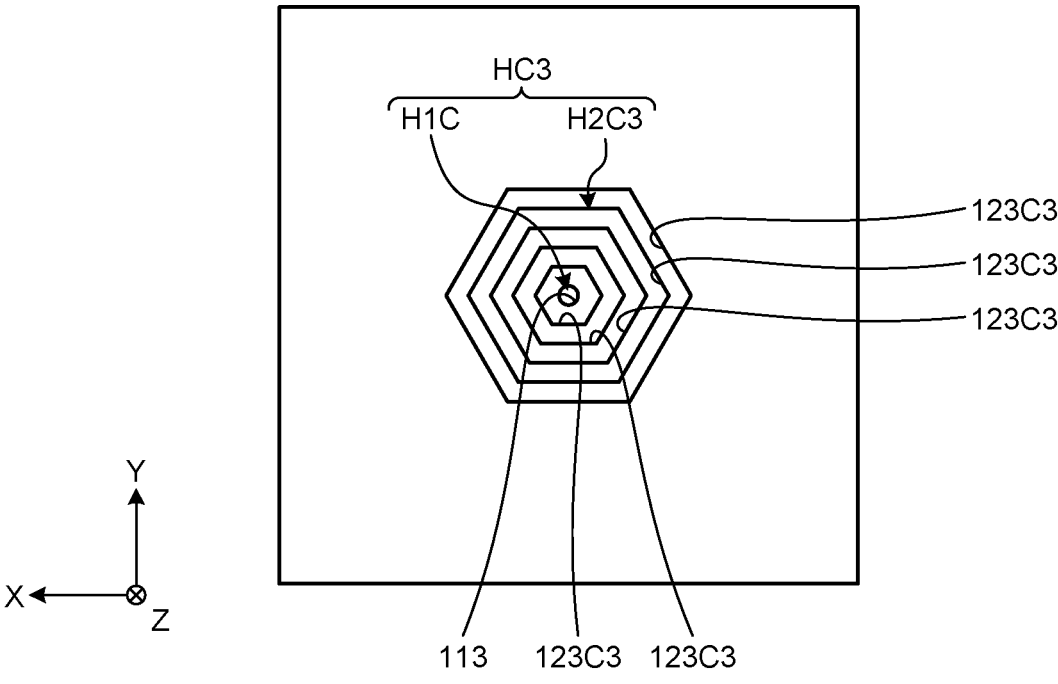
FIG. 13 is a view illustrating an example of an aperture shape of a pinhole body.

Some examples of the aperture shape of the second hole of the pinhole body will be described with reference to FIGS. 11 to 13. Here, a case where the second hole has a staircase shape (corresponding to the pinhole body 10C in FIG. 8) will be described as an example. FIGS. 11 to 13 are rear views illustrating an example of an appearance of a schematic configuration of the pinhole body.

In the through hole HC1 illustrated in FIG. 11, the aperture of a second hole H2C1 has a circular shape similarly to the aperture of the first hole H1C. In the figure, a surface forming the second hole H2C1 is illustrated as an inner side surface 123C1.

In a through hole HC2 illustrated in FIG. 12, the aperture of a second hole H2C2 has a rectangular shape (in this example, a square shape). In the figure, a surface forming the second hole H2C2 is illustrated as an inner side surface 123C2.

In a through hole HC3 illustrated in FIG. 13, the aperture of a second hole H2C3 has a polygonal shape (hexagonal shape in this example). In the figure, a surface forming the second hole H2C3 is illustrated as an inner side surface 123C3.

Since the aperture of the second hole has a rectangular shape, a polygonal shape, or the like as illustrated in FIGS. 12 and 13, it is possible, with a plurality of through holes, to increase (for example, maximize) the area of the image while suppressing overlapping of images formed by adjacent through holes, as compared with the case of the circular shape. This leads to acquisition of a larger amount of information.

2.2 Arrangement Example of Plurality of Through Holes Having Different Aperture Areas.

In one embodiment, the pinhole body has a plurality of through holes having aperture areas different from each other. This will be described with reference to FIG. 14.

Figure 14:
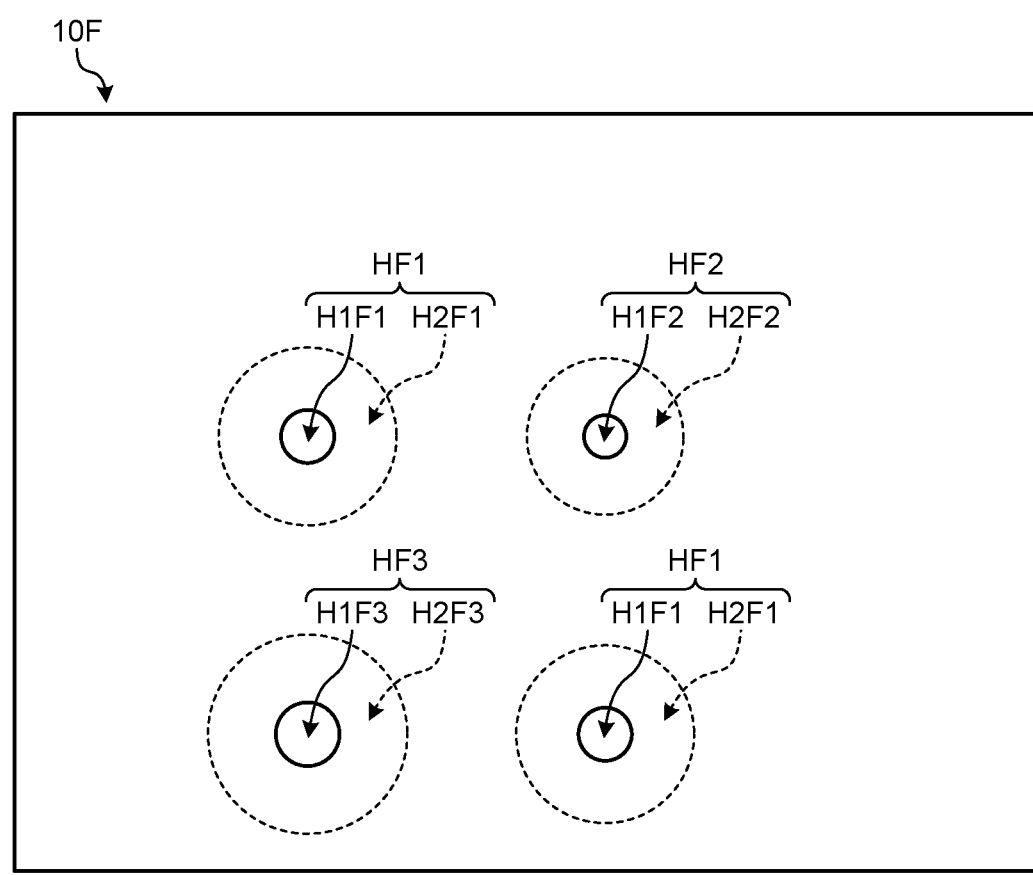
FIG. 14 is a view illustrating an arrangement example of a plurality of through holes having different aperture areas.
Figure 14:
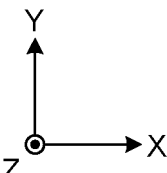

FIG. 14 is a diagram illustrating an example of arrangement of a plurality of through holes having different aperture areas. A pinhole body 10F illustrated in FIG. 14 has three types of through holes: a through hole HF1 to a through hole HF3. FIG. 14 is a front view of the pinhole body 10F. An optical sensor (not illustrated) that receives light passing through the through holes HF1 to HF3 is provided behind the through holes HF1 to HF3.

The through holes HF1 to HF3 have aperture areas different from each other, and are provided at different positions. In this example, the aperture area (for example, 40 μm) of a first hole H1F2 of the through hole HF2 is smaller than the aperture area (for example, 50 μm) of a first hole H1F1 of the through hole HF1. An aperture area (for example, 60 μm) of a first hole H1F3 of the through hole HF3 is larger than an aperture area of the first hole H1F1 of the through hole HF1. A second hole H2F1 of the through hole HF1, a second hole H2F2 of the through hole HF2, and a second hole H2F3 of the through hole HF3 may have a similar relationship. There may be a plurality of through holes having the same aperture area, and in this example, there are two through holes HF1.

In the light detection device including the pinhole body 10F, the light passing through each of the plurality of through holes can be detected by the optical sensor. In this case, by using the detection results of the plurality of beams of light, it is possible to obtain an optimum detection result (for example, an image or the like) as compared with the case of using only the detection result of one beam of light. For example, since the depth of field varies depending on the distance to the subject, the wavelength of light, and the like, it is possible to use the detection result of the light passing through the through hole giving the optimum depth of field among the plurality of through holes. By using the detection result of the light passing through the through hole other than the through hole giving the optimum depth of field, it is also possible to improve the detection accuracy (for example, image recognition accuracy or the like).

2.3 Example of Pinhole Array

In one embodiment, the pinhole body is provided as a pinhole array having a plurality of through holes provided in the form of an array. This will be described with reference to FIGS. 15 to 18.

Figure 15:
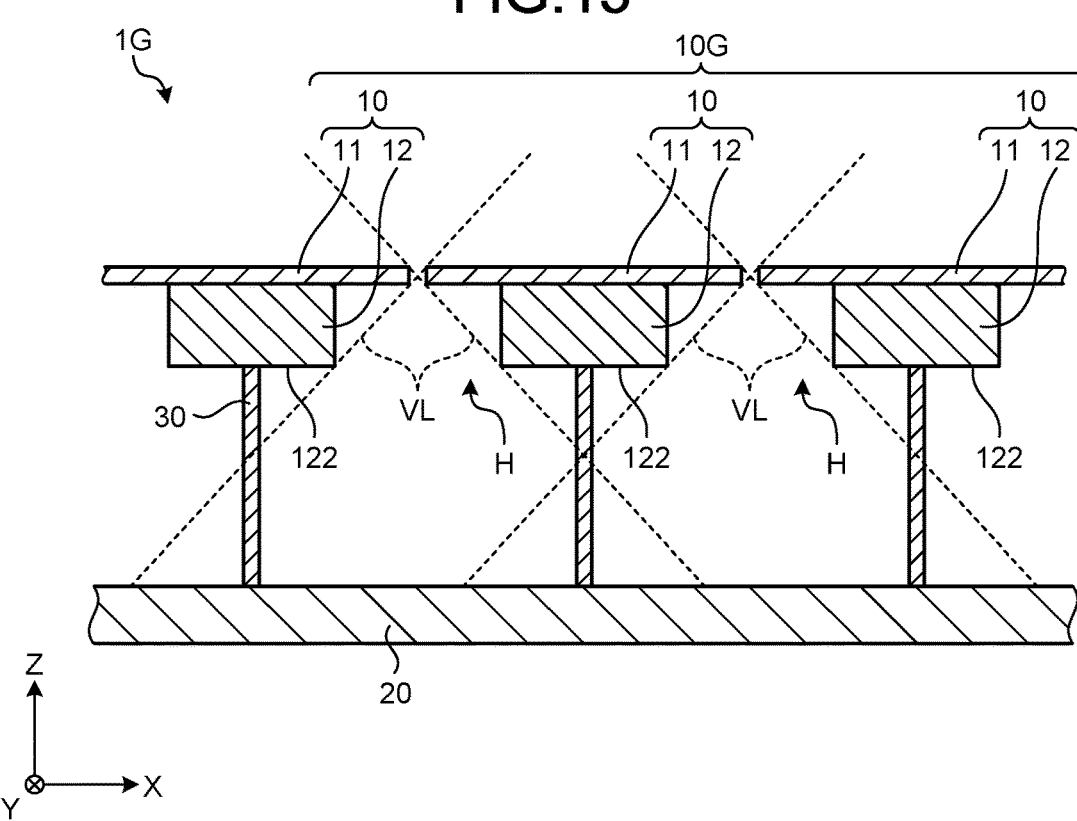
FIG. 15 is a diagram illustrating an example of a schematic configuration of a light detection device including a pinhole array.

FIG. 15 is a diagram illustrating an example of a schematic configuration of a light detection device including a pinhole array. As compared with the pinhole body 10 (FIG. 3), a light detection device 1G illustrated in FIG. 15 has a difference in that it includes a pinhole body 10G instead of the pinhole body 10 and further includes a wall 30.

The pinhole body 10G has a plurality of through holes H provided in the form of an array. In this example, the pinhole body 10G is formed as a plurality of pinhole bodies 10 provided in the form of an array.

The wall 30 extends from a region between the plurality of through holes H toward a corresponding region of the optical sensor 20. In this example, the wall 30 extends from the back surface 122 of the base portion 12 towards the optical sensor 20. One end of the wall 30 is in contact with the back surface 122 of the base portion 12. The other end of the wall 30 is in contact with the optical sensor 20. The wall 30 is provided so as to block the angle of view line VL (so as to intersect the angle of view line VL). The wall 30 may be made of the same material as or a different material from base portion 12 of the pinhole body 10. The surface of the wall 30 may have a light absorbing surface. With this configuration, light reflection on the wall 30 is suppressed, leading to reduction of noise caused by reflected light. The light absorbing surface may be similar to the light absorbing surface of the inner side surface 113 described above.

In the case of the light detection device 1G without the wall 30, unnecessary light from another through hole H (for example, an adjacent through hole H) is incident on the optical sensor 20. By comparison, in the case of the light detection device 1 including the wall 30, even when the pinhole bodies 10 are not arranged apart from each other, it is still possible to prevent incidence of unnecessary light, that is, prevent overlapping of images formed by the adjacent through holes H. This makes it possible to acquire a large amount of information with a small light receiving area (for example, an imaging area).

The above is example in which the wall 30 is in contact with the optical sensor 20. Alternatively, the wall may be separated from the optical sensor. In a light detection device 1H illustrated in FIG. 16, the other end of a wall 30H is separated from the optical sensor 20. Also in this case, since the wall 30H is provided so as to block the angle of view line VL, the effect similar to the effect of the wall 30 is obtained.

Note that, instead of the other end of the wall 30H, one end of the wall 30H may be separated from the base portion 12.

Figure 17:
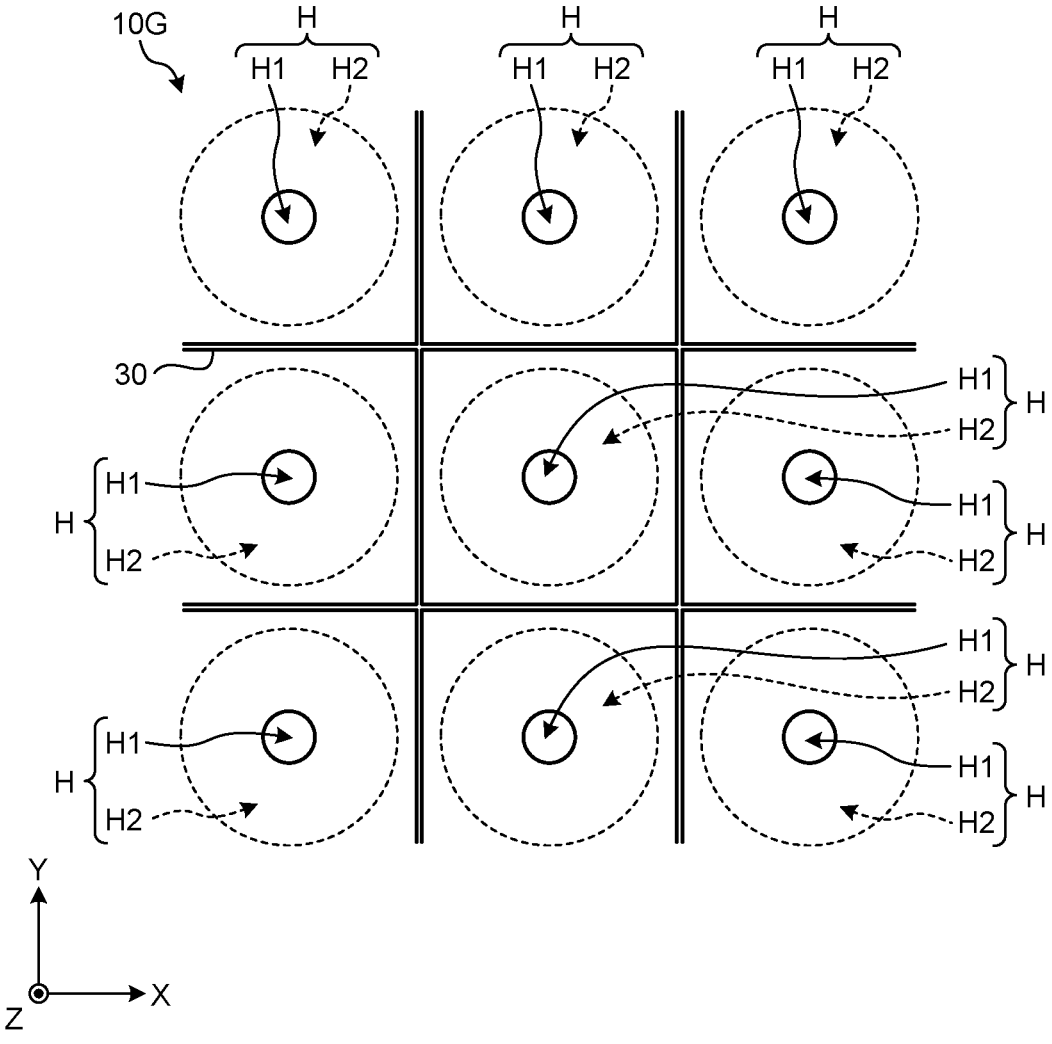
FIG. 17 is a diagram illustrating an example of arrangement of through holes and walls in a pinhole array.

FIG. 17 is a diagram illustrating an example of arrangement of through holes and walls in the pinhole array. FIG. 17 illustrates an example of a schematic configuration of a front view of the pinhole body 10G (plan view of the array). In this example, the plurality of through holes H are arranged at equal intervals in the X-axis direction and the Y-axis direction (the row direction and the column direction). The wall 30 partitions the through hole H into a quadrangular shape.

Figures 18, 19:
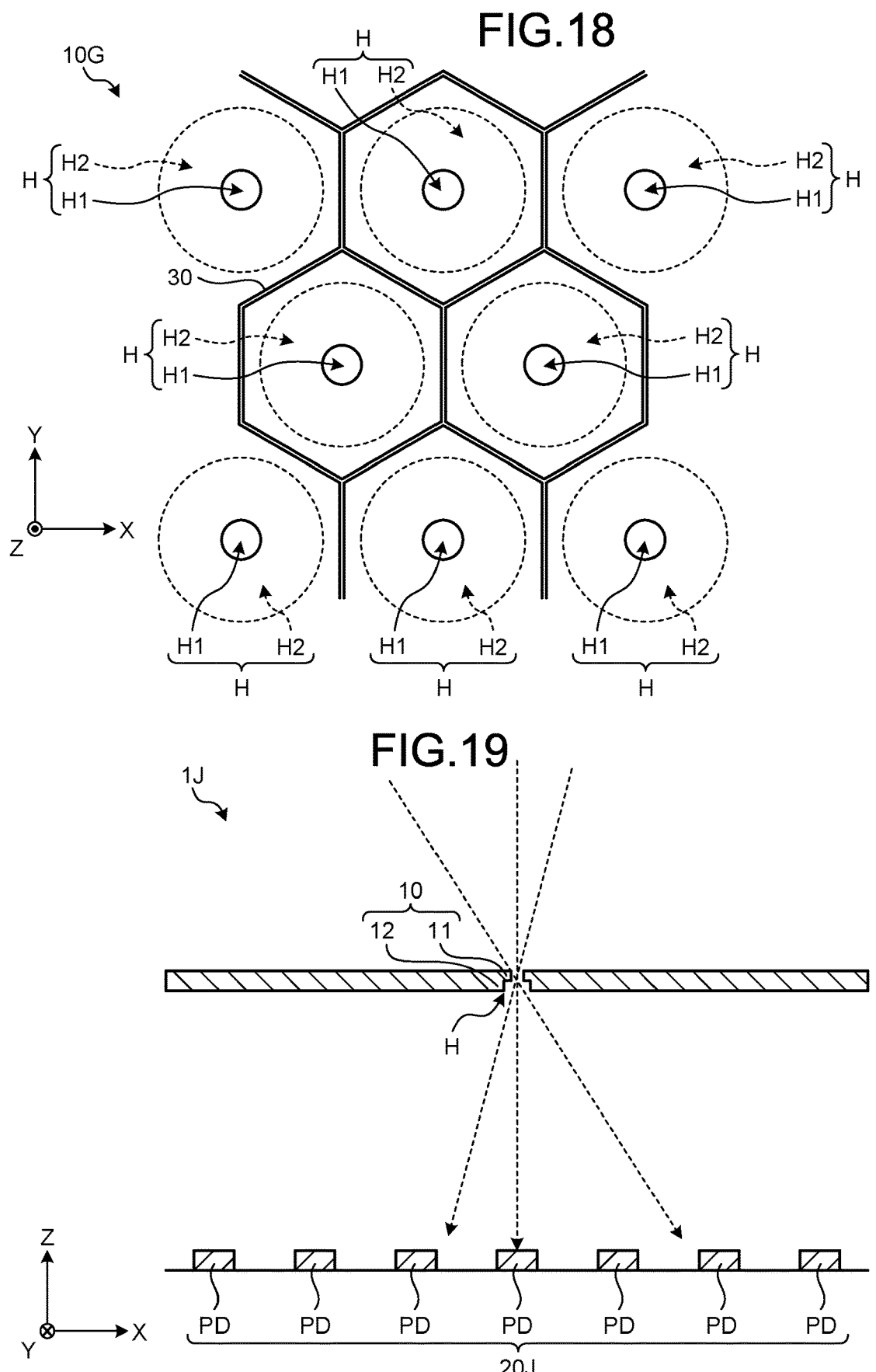
FIG. 18 is a diagram illustrating an example of arrangement of through holes and walls in a pinhole array.
FIG. 19 is a view illustrating an example of a photodiode array used as an optical sensor.

FIG. 18 is a diagram illustrating another example of the arrangement of the through holes and the walls in the pinhole array. FIG. 18 illustrates another example of a schematic configuration of a front view of the pinhole body 10G (plan view of the array). In this example, the through holes H in adjacent columns (or rows) are arranged to be shifted from each other by an interval that is half the interval of the through holes H in each column. The wall 30 partitions the through hole H into a hexagonal shape.

Not limited to the example illustrated in FIGS. 17 and 18, the wall 30 may partition the through hole H into any polygonal shape. This achieves high density arrangement of the plurality of through holes H.

2.4 Example of Photodiode Sensor

Typical examples of the optical sensor used in the light detection device include a complementary metal oxide semiconductor (CMOS) sensor and a charge coupled device (CCD) sensor. Alternatively, it is also allowable to use a sensor other than these sensors, for example, a photodiode array. This will be described with reference to FIG. 19.

FIG. 19 is a diagram illustrating an example of a photodiode array used as an optical sensor. An optical sensor 20J included in a light detection device 1J illustrated in FIG. 19 includes a plurality of photodiodes PD provided in the form of an array. The photodiodes PD may be provided separated from each other. An example of the separation distance is 2 to 100 times the size of the photodiode PD.

Using a device such as a CMOS sensor or a CCD sensor as the optical sensor will increase the unit price of the optical sensor. In addition, when using a light detection device using a pinhole body, an image is formed in a wide range, but the brightness is greatly different between the center and the periphery of the image. When imaging with this condition is performed by a single type of device, it is necessary to use a device having a very large dynamic range. Meanwhile, there is another case where the definition and the like of the obtained image are not so high and it is not necessary to reduce the pixel size of the optical sensor (image sensor) (where there is no need to use a high-definition sensor). In this case, by using the optical sensor 20J (photodiode array) with reference to FIG. 19, it is possible to reduce the cost for the optical sensor while satisfying the required definition and the like. In addition, by using a photodiode PD different for each position (portion) in the optical sensor 20J or by providing an A/D conversion characteristic (A/D system) different for each position, it is possible to achieve a sufficient dynamic range as a whole even if the dynamic range for each photodiode PD is not large. Furthermore, by arranging photodiodes having different effective light receiving wavelength bands, it is possible to constitute a sensor having a wide wavelength band.

2.5 Example of Mounting on Display

The light detection device may be mounted on a transmissive display. This will be described with reference to FIG. 20.

Figure 20:
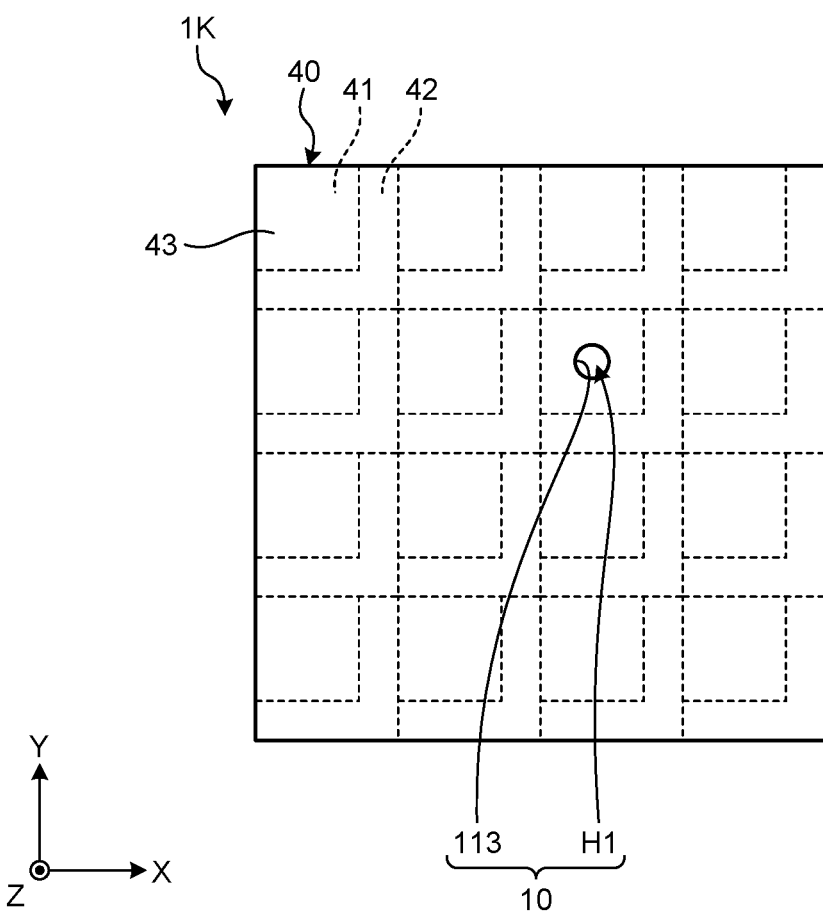
FIG. 20 is a diagram illustrating an example of a schematic configuration of a display equipped with a light detection device.

FIG. 20 is a diagram illustrating an example of a schematic configuration of a display equipped with a light detection device. In the example illustrated in FIG. 20, a light detection device 1K is provided in a transmissive display 40. An example of the transmissive display 40 is an organic light emitting diode (OLED) display.

The transmissive display 40 includes a plurality of display pixel regions 41 and a corresponding plurality of wiring regions 42.

The display pixel region 41 includes display pixels corresponding to individual colors of RGB, for example. The interval (pitch) of the adjacent display pixel regions 41 is 0.065 mm, for example. The display pixel region 41 is a portion that transmits light (light transmitting portion).

The wiring region 42 includes a thin film transistor (TFT), a signal line, and the like used for purposes such as pixel driving of the corresponding display pixel region 41. The wiring region 42 is a portion that does not transmit light.

The light detection device 1K is provided in the transmissive display 40 such that the through hole H is located in the display pixel region 41 (light transmitting portion). FIG. 20 illustrates the first hole H1 and the inner side surface 113 of the through hole H within the pinhole body 10. The second hole H2 and the optical sensor 20 described above are provided behind the first hole H1.

The transmissive display 40 is provided with a light shielding member 43. In the example illustrated in the drawing, the light shielding member 43 has substantially the same size (area) as the transmissive display 40. The light shielding member 43 shields a portion other than the through hole H in the transmissive display 40. The light shielding member 43 may be built, for example, when forming a TFT layer in the wiring region 42. With the present of the light shielding member 43, the transmissive display 40 has a structure that transmits light only through the first hole H1 and does not transmit light through other portions.

According to the light detection device 1K, it is possible to perform both display of an image and a video by the transmissive display 40 and detection (for example, imaging) of light from the front of the transmissive display 40.

2.6 Example of Fingerprint Sensor

The light detection device can be used for various applications including an image sensor (imaging device or the like). In an embodiment, the light detection device is applied as a fingerprint sensor (fingerprint detection device). This will be described with reference to FIG. 21.

Figure 21:
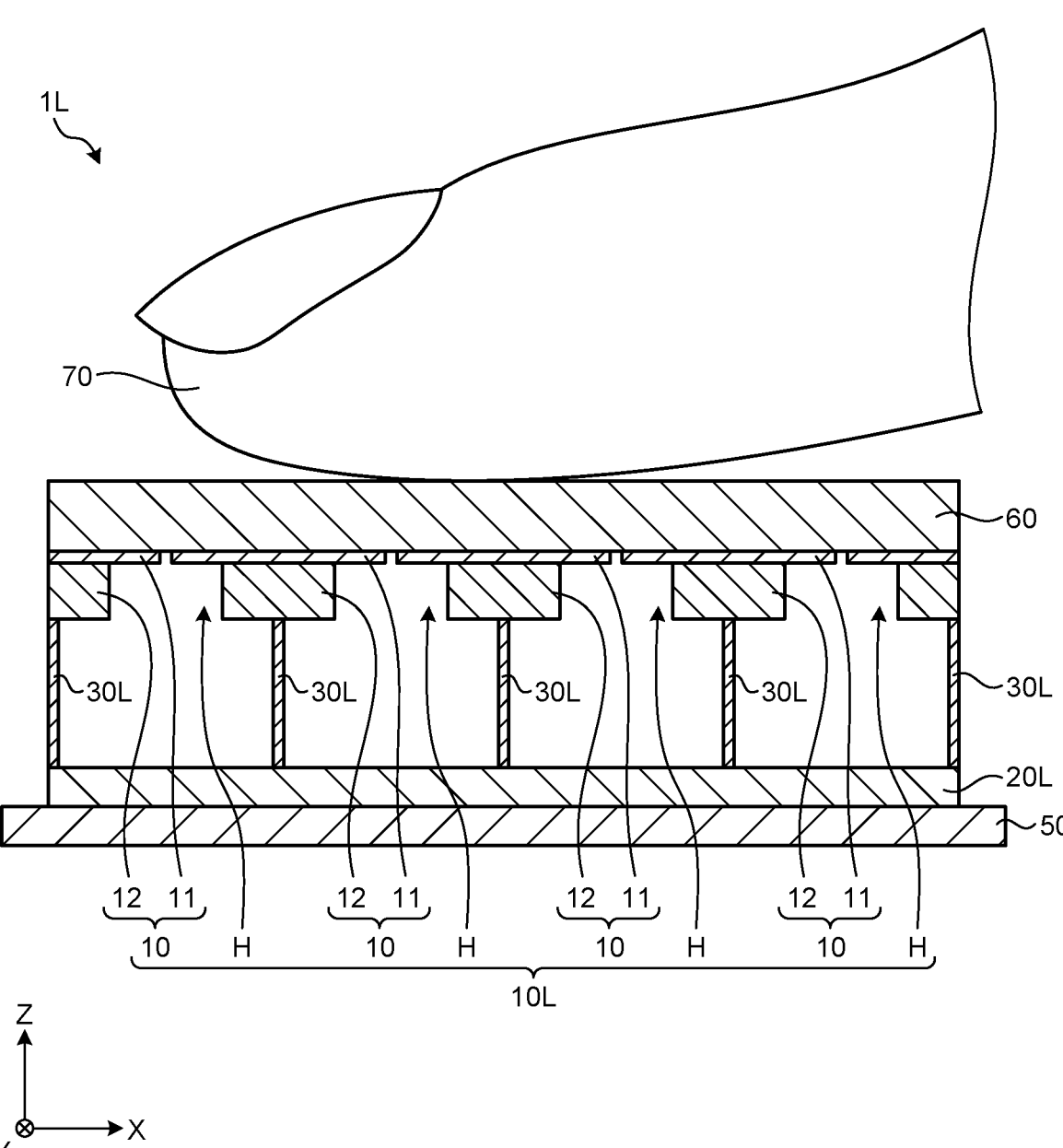
FIG. 21 is a diagram illustrating an example of a schematic configuration of a light detection device applied as a fingerprint sensor.

FIG. 21 is a diagram illustrating an example of a schematic configuration of a light detection device applied as a fingerprint sensor. A light detection device 1L illustrated in FIG. 21 includes a pinhole body 10L, an optical sensor 20L, a wall 30L, a substrate 50, and a light guide plate 60 (for example, a glass plate). The pinhole body 10L includes a plurality of pinhole bodies 10 provided in the form of an array. The optical sensor 20L is a CMOS sensor, for example, and is provided on the light guide plate 60. The light guide plate 60 is provided in the pinhole body 10 L provided as a pinhole array. When a fingertip 70 is placed on the light guide plate 60, light from the corresponding portion of the fingertip 70 passes through the light guide plate 60 and the through hole H, and is detected by the optical sensor 20L. This detection result is acquired as fingerprint data (captured data) immediately above the through hole H. By cutting out and recombining a necessary portion of the captured data, a fingerprint image is generated.

3. APPLICATION EXAMPLES

Various forms of the light detection device described so far may be used alone or in combination as appropriate.

Some examples will be described for a specific usage (application) of the light detection device.

An example of the first application is fingerprint authentication. In this case, for example, as described above with reference to FIGS. 17, 18, and 21, the fingerprint image is acquired in close-up by the light detection device including the pinhole array. Examples of applicable plate member through which a micropore (particularly indicating the first hole in a through hole) is drilled include various materials such as a metal having a thickness of 500 μm, a metal foil having a thickness of several nm, and an organic material such as leather. When the aperture of the micropore has a circular shape, an aperture area having a diameter of about 30μ is optimal. This makes it possible to achieve both a size which is small enough but does not impair the sense of quality and a size large enough for achieving high luminance. For a smartphone, a wearable device, and the like, it is suitable to use a configuration in which the light detection device is used for a display (refer to FIG. 20). Examples of wearable devices are smartwatches, head mounted displays (HMDs), and eyeglasses.

A second application example is face authentication. In this case, a face image at a position away from several tens of centimeters to several meters is collected by the light detection device. Compared with the fingerprint authentication described above, the distance to the user is long, and thus, the demand for the sense of quality is less strict. The light detection device may be incorporated in a wall, an electrical appliance, or the like. Examples of applicable plate member through which a micropore is drilled include various materials such as a metal having a thickness of 500 μm, a metal foil having a thickness of several nm, and an organic material such as leather. Fabrication by printing is also possible. The optimum size of the micropore size varies depending on the authentication distance. When the authentication distance is about 30 cm, an aperture area having a diameter of about 30 μm is optimal. When the authentication distance is about 3 m, an aperture area having a diameter of about 300 μm is optimal. In the case of a TV, a configuration of utilizing the light detection device in a display (refer to FIG. 20) is suitable.

A third application example is object recognition in a refrigerator. In this case, the light detection device recognizes what is in the refrigerator. A refrigerator is often stuffed with many items, and blind spots are likely to occur, making it necessary to arrange a large number of sensors in order to prevent the blind spots. A micropore having a diameter of about 100 μm is drilled in a wall of a refrigerator, and an image is formed through the micropore. A large number of low-cost light detection devices of about 1 mm may be disposed on the entire walls, such as front, rear, left, right, and top and bottom walls inside the refrigerator.

A fourth application example is a fall detection sensor. In this case, the light detection device monitors an abnormal state, such as a fall of a person falls due to illness or the like. There is also a demand for monitoring in a place in consideration of privacy, such as a bath or a toilet. Basically, the same device as the face authentication is assumed. On the other hand, in a configuration considering privacy in particular, a photodiode array (refer to FIG. 19) may be used as the imaging element instead of the CMOS.

A fifth application example is automotive external sensing. Sensing at various wavelengths is needed. A high depth of field is also needed. A configuration including a plurality of micropores having different aperture areas (refer to FIG. 14) may be used. This is because a configuration capable of simultaneously utilizing a plurality of wavelengths and depth of field in the same sensor may be suitable.

A sixth application example is a human sensor and a fire detection sensor. Sensing at various wavelengths is needed. On the other hand, low power consumption is needed. As the imaging element, a photodiode array (refer to FIG. 19) may be used instead of a CMOS sensor or the like. By arranging PDs having different light receiving wavelengths, it is possible to have a configuration suitable for collecting information of various wavelengths at the same time.

4. EFFECTS

The light detection device described above is specified as follows, for example. As described with reference to FIG. 3 and the like, the light detection device 1 includes: the pinhole body 10 having the through hole H; and the optical sensor 20 that is provided behind the pinhole body 10 and receives light transmitted through the through hole H. The first aperture O1 of the through hole H arranged on the front surface 111 (first surface on the light incident surface side) of the pinhole body 10 is smaller than the second aperture O2 of the through hole H arranged on the back surface 122 (second surface opposite to the first surface). For example, the through hole H may have the first hole H1 including the first aperture O1 and the second hole H2 including the second aperture O2, in which the depth of the second hole H2 from the back surface 122 may be greater than the depth of the first hole H1 from the front surface 111. The second hole H2 may have a size that does not interfere with image formation by the first hole H1.

In the light detection device 1 described above, the first aperture O1 having a small aperture area, among the first aperture O1 and the second aperture O2 (the first hole H1 and the second hole H2), functions as an aperture of the pinhole. Since the second aperture O2 has an aperture area larger than that of the first aperture O1, the second aperture O2 does not interfere with the pinhole function of the first aperture O1. In the presence of not only the portion corresponding to the first aperture O1 (surface portion 11) but also the portion corresponding to the second aperture O2 (base portion 12), the thickness of the pinhole body 10 is easily maintained (or easily increased). The angle of view V can be increased by thinning the portion (surface portion 11) corresponding to the first aperture O1. Even in this case, since the thickness of pinhole body 10 is maintained, the sense of quality would not be impaired. This configuration also maintains the strength. For example, if there is a partially thin portion in the pinhole body 10, the sense of quality might be deteriorated at the time of processing such as hairline processing. However, this configuration can also suppress such deterioration in the sense of quality.

As described with reference to FIG. 3 and the like, the aperture area of the second hole H2 may be constant with respect to the depth direction of the second hole H2. Since the second hole H2 has such a simple shape, the second hole H2 can be easily obtained.

As described with reference to FIGS. 6 to 10 and the like, the aperture area of the second hole H2A to the second hole H2E may substantially increase toward the deeper portions in the depth direction of the second hole H2A to the second hole H2E. Examples of cross-sectional shapes of such second holes include a funnel shape (FIG. 7), a staircase shape (FIG. 8) and a wedge shape (FIGS. 9 and 10). According to the second hole H2A to the second hole H2E with these shapes, the light reflected by the light receiving surface 20a of the optical sensor 20 is suppressed from being reflected again in the second hole H2A to the second hole H2E and returning to the light receiving surface 20a.

As described with reference to FIGS. 12 and 13, the aperture of the second hole H2C2 and the aperture of the second hole H2C2 may have a polygonal shape. With these shapes, for example, in a case where a plurality of through holes is provided, it is possible to increase the area of images while suppressing overlapping of images formed by adjacent holes. This leads to acquisition of a larger amount of information.

As described with reference to FIG. 14, the pinhole body 10F may have the through holes HF1 to HF3 having aperture areas different from each other. By using the detection results of the plurality of beams of light passing through the individual through holes, it is possible to obtain an optimum detection result (for example, an image or the like) as compared with the case of using only the detection result of one beam of light.

Figure 16:
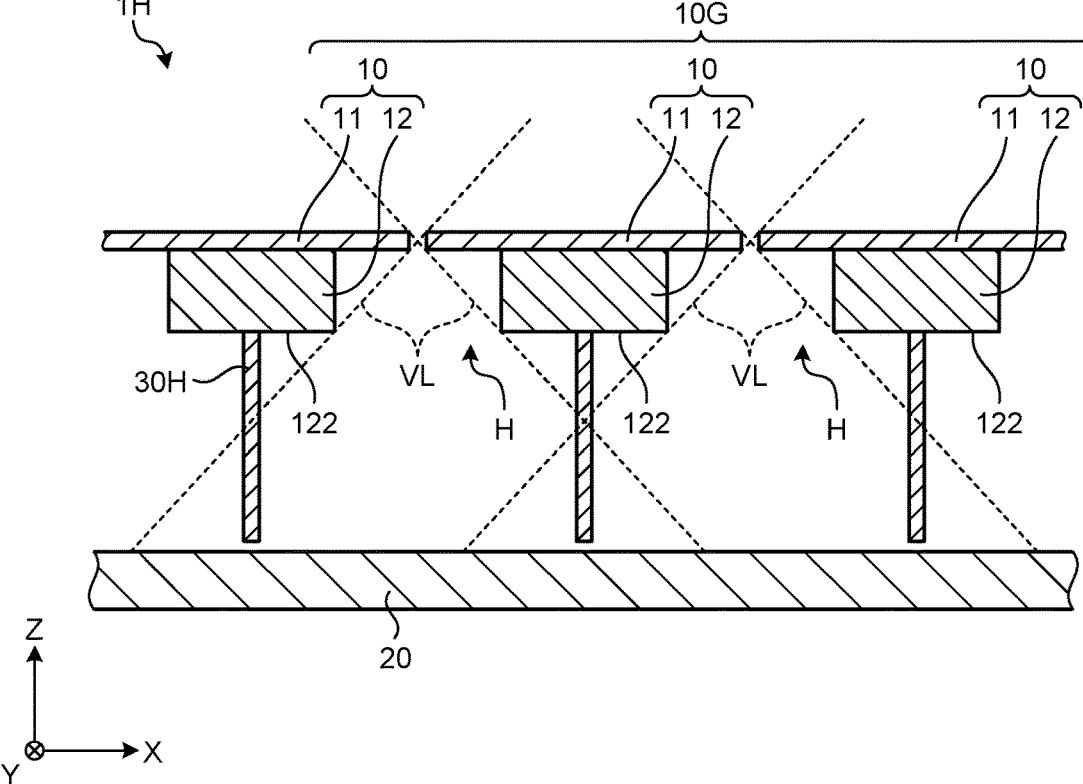
FIG. 16 is a diagram illustrating an example of a schematic configuration of a light detection device including a pinhole array.

As described with reference to FIGS. 15, 16, and the like, the pinhole body 10G may be a pinhole array having the plurality of through holes H provided in the form of an array. The light detection device 1G may further include the wall 30 extending from a region between the plurality of through holes H toward a corresponding region of the optical sensor 20. This makes it possible to prevent incidence of unnecessary light, that is, overlapping of images formed by adjacent through holes H with each other. This makes it possible to acquire a large amount of information with a small light receiving area (for example, an imaging area).

As described with reference to FIGS. 17 and 18, when the pinhole body 10G (pinhole array) is viewed from the front, the wall 30 may be disposed so as to partition the through hole H into a polygonal shape. This makes it possible to arrange the plurality of through holes H at high density.

As described with reference to FIG. 19, the optical sensor 20J may be a photodiode array in which a plurality of photodiodes is arranged separated from each other. This can reduce the cost of the optical sensor.

As described with reference to FIG. 20, the light detection device 1K may be provided in the transmissive display 40 such that the through hole H is located in the light transmitting portion (display pixel region 41) of the transmissive display 40. This makes it possible to perform both display of an image and a video by the transmissive display 40 and detection (for example, imaging) of light from the front of the transmissive display 40.

As described with reference to FIG. 3, the pinhole body 10 may be a stacked body. This makes it possible to obtain the pinhole body 10 having a desired thickness using a plurality of plate members.

The pinhole body 10 may have inner side surfaces (the inner side surface 113 and the inner side surface 123) forming the through hole H, and the inner side surface (the inner side surface 113 and/or the inner side surface 123) may have a light absorbing surface. With this configuration, light reflection in the through hole H is suppressed, making it possible to reduce the noise caused by reflected light.

The pinhole body 10 may have the back surface 122 facing the optical sensor 20, and the back surface 122 may have a light absorbing surface. With this configuration, light reflection on the back surface 122 is suppressed, making it possible to reduce the noise caused by reflected light.

The light detection device may be an imaging device or a fingerprint detection device as described with reference to FIG. 21. This makes it possible to provide an imaging device or a fingerprint detection device capable of suppressing impairment of sense of quality.

5. EXAMPLE OF APPLICATION TO MOVING OBJECT

The technology according to the present disclosure (the present technology) is applicable to various products. The technology according to the present disclosure may be applied to devices mounted on any of moving objects such as automobiles, electric vehicles, hybrid electric vehicles, motorcycles, bicycles, personal mobility, airplanes, drones, ships, and robots.

Figure 22:
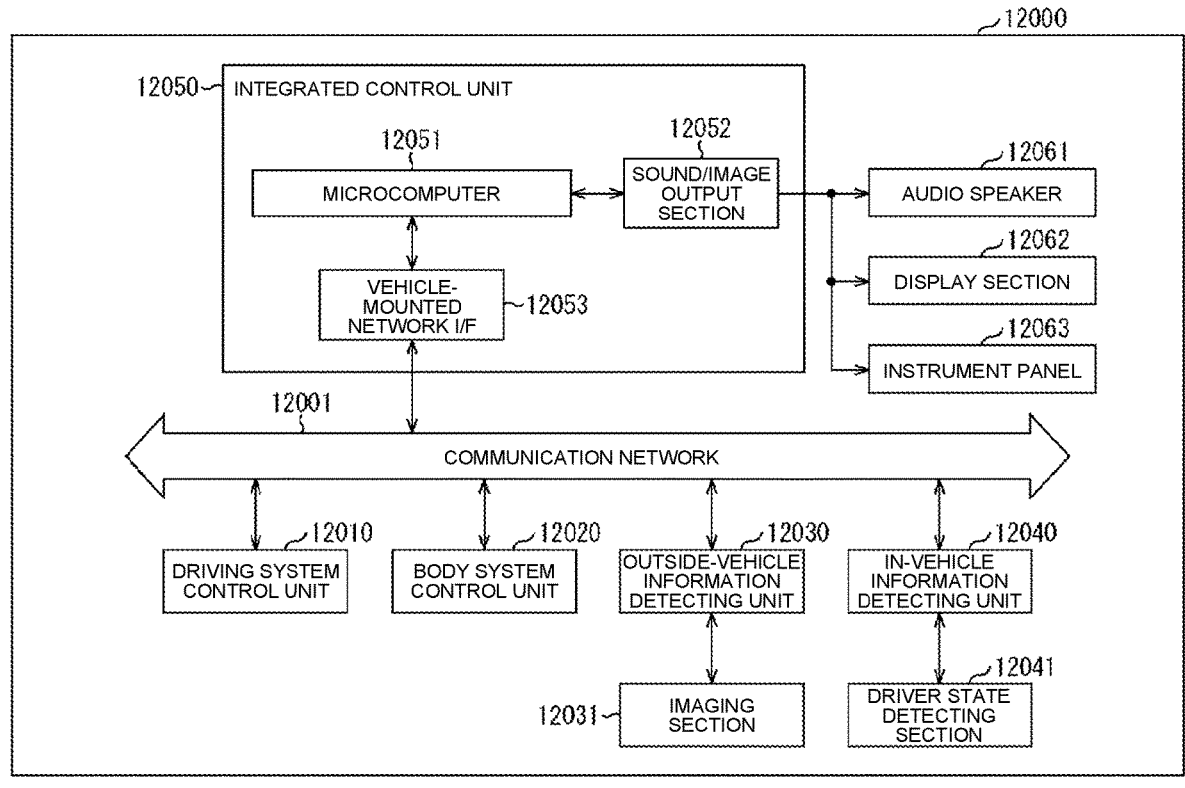
FIG. 22 is a block diagram illustrating an example of schematic configuration of a vehicle control system.

FIG. 22 is a block diagram illustrating a schematic configuration example of a vehicle control system, which is an example of a moving object control system to which the technology according to the present disclosure is applicable.

The vehicle control system 12000 includes a plurality of electronic control units connected to each other via a communication network 12001. In the example illustrated in FIG. 22, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 22, an audio speaker 12061, a display section 12062, and an instrument panel 12063 are illustrated as the output device. The display section 12062 may, for example, include at least one of an on-board display and a head-up display.

Figure 23:
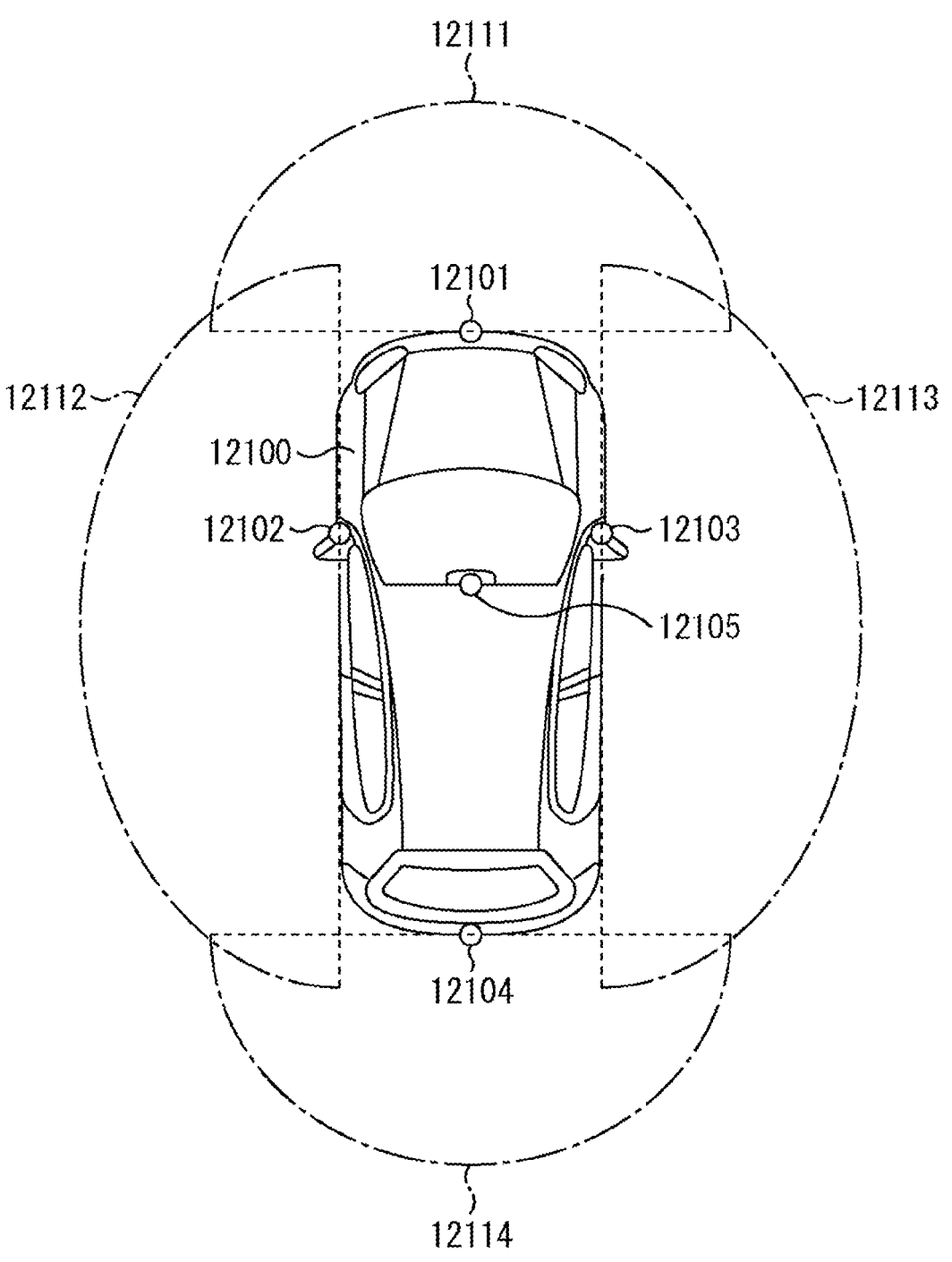
FIG. 23 is a diagram illustrating an example of installation positions of an outside-vehicle information detector and an imaging section.

FIG. 23 is a diagram illustrating an example of the installation position of the imaging section 12031.

In FIG. 23, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 23 illustrates an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Hereinabove, an example of the vehicle control system to which the technology according to the present disclosure is applicable has been described. The technology according to the present disclosure can be suitably applied to the imaging section 12031 among the configurations described above. By applying the technology according to the present disclosure to the imaging section 12031, it is possible to suppress impairment of sense of quality.

6. EXAMPLE OF APPLICATION TO ENDOSCOPIC SURGERY SYSTEM

The technology according to the present disclosure (the present technology) is applicable to various products. For example, the techniques according to the present disclosure may be applied to endoscopic surgery systems.

Figure 24:
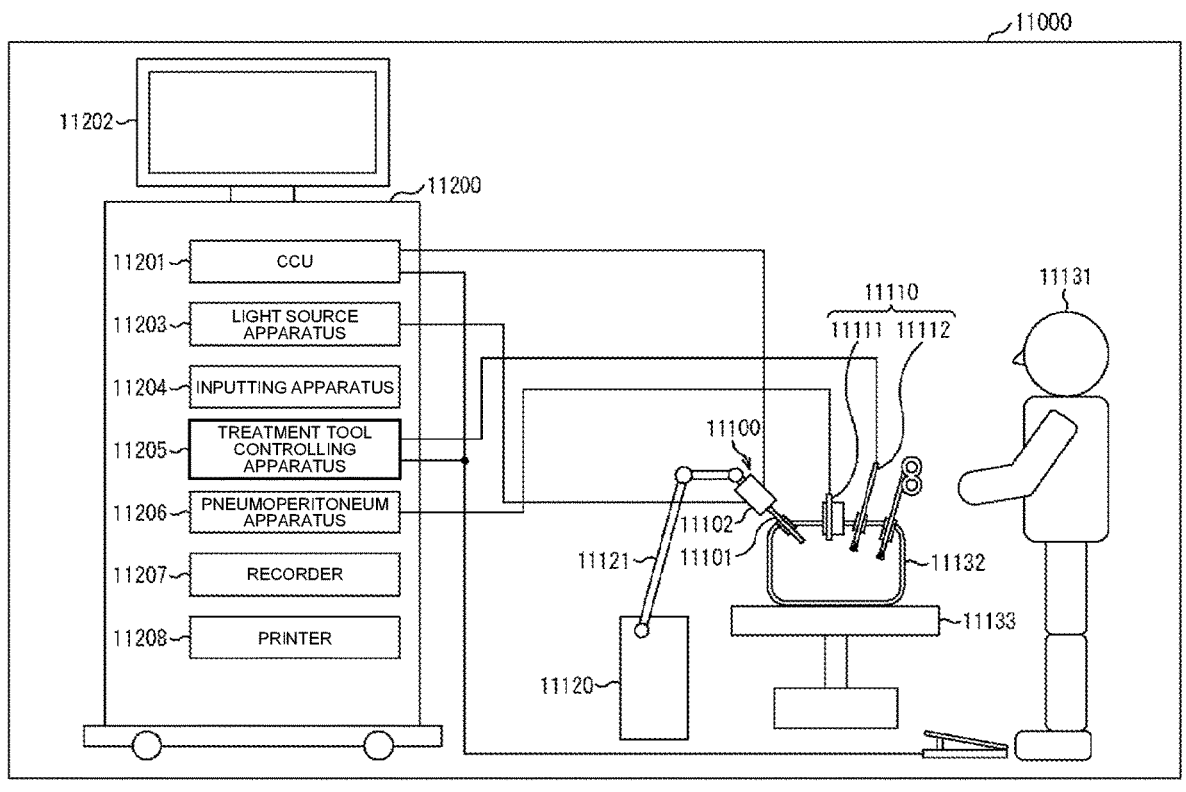
FIG. 24 is a diagram illustrating an example of a schematic configuration of an endoscopic surgery system.

FIG. 24 is a view illustrating an example of a schematic configuration of an endoscopic surgery system to which the technology according to an embodiment of the present disclosure (present technology) can be applied.

In FIG. 24, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy treatment tool 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body lumen of the patient 11132, and a camera head 11102 connected to a proximal end of the lens barrel 11101. In the example depicted, the endoscope 11100 is depicted which includes as a hard mirror having the lens barrel 11101 of the hard type. However, the endoscope 11100 may otherwise be included as a soft mirror having the lens barrel 11101 of the soft type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body lumen of the patient 11132 through the objective lens. It is to be noted that the endoscope 11100 may be a direct view mirror or may be a perspective view mirror or a side view mirror.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy treatment tool 11112 for cautery or incision of a tissue, sealing of a blood vessel or the like. A pneumoperitoneum apparatus 11206 feeds gas into a body lumen of the patient 11132 through the pneumoperitoneum tube 11111 to inflate the body lumen in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 25:
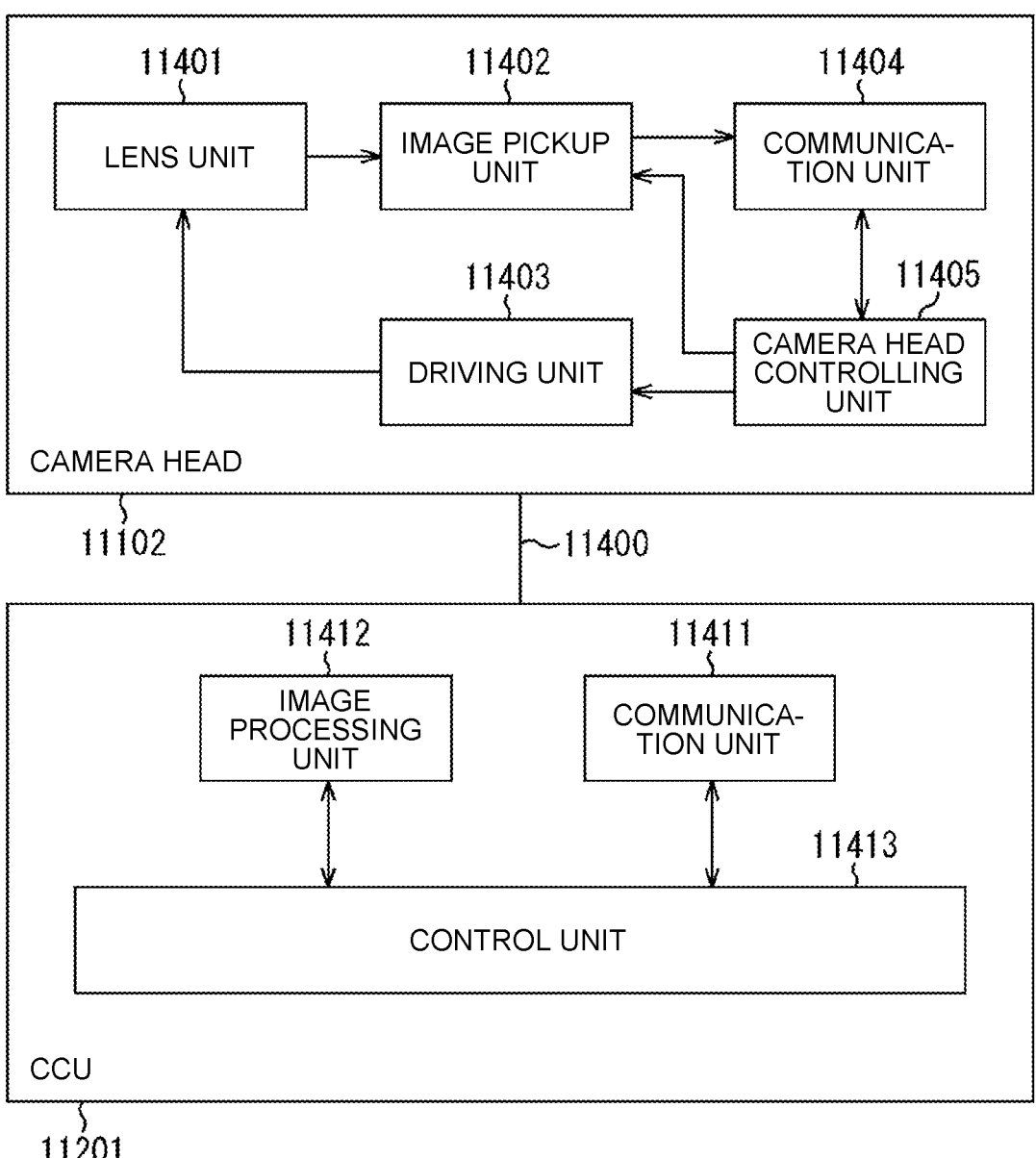
FIG. 25 is a block diagram illustrating an example of a functional configuration of a camera head and a CCU.

FIG. 25 is a block diagram illustrating an example of a functional configuration of the camera head 11102 and the CCU 11201 illustrated in FIG. 24.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy treatment tool 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure can be applied has been described above. The technique according to the present disclosure can be applied to the image pickup unit 11402 of the camera head 11102 among the configurations described above. Application of the technology according to the present disclosure to the camera head 11102 makes it possible to suppress impairment of the sense of quality.

Although the endoscopic surgery system has been described here as an example, the technique according to the present disclosure may be applied to, for example, a microscopic surgery system or the like.

The embodiments of the present disclosure have been described above. However, the technical scope of the present disclosure is not limited to the above-described embodiments, and various modifications can be made without departing from the scope of the present disclosure. Moreover, it is allowable to combine the components across different embodiments and modifications as appropriate.

The effects described in individual embodiments of the present specification are merely examples, and thus, there may be other effects, not limited to the exemplified effects.

Note that the present technique can also have the following configurations.

(1)

A light detection device comprising:

a pinhole body provided with a through hole; and an optical sensor that is provided behind the pinhole body and receives light transmitted through the through hole, wherein a first aperture of the through hole is smaller than a second aperture of the through hole, the first aperture being provided in a first surface of the pinhole body, the first surface being a surface on an incident surface side of the light, the second aperture being provided in a second surface of the pinhole body, the second surface being a surface opposite to the first surface.

(2)

The light detection device according to (1), wherein the through hole includes: a first hole including the first aperture; and a second hole including the second aperture, and a depth of the second hole from the second surface is greater than a depth of the first hole from the first surface.

(3)

The light detection device according to (2), wherein the second hole has a size that does not hinder image formation performed through the first hole.

(4)

The light detection device according to (2) or (3), wherein an aperture area of the second hole is constant with respect to a depth direction of the second hole.

(5)

The light detection device according to any one of (2) to (4), wherein an aperture area of the second hole is substantially increased toward deeper portions in a depth direction of the second hole.

(6)

The light detection device according to any one of (2) to (5), wherein the second hole has at least one cross-sectional shape selected from a funnel shape, a staircase shape, and a wedge shape, when viewed from a direction intersecting a depth direction of the second hole.

(7)

The light detection device according to any one of (2) to (6), wherein the aperture of the second hole has a polygonal shape.

(8)

The light detection device according to any one of (2) to (7), wherein the pinhole body includes a plurality of the through holes having mutually different aperture areas.

(9)

The light detection device according to any one of (1) to (8), the pinhole body being provided as a pinhole array, the pinhole array including a plurality of the through holes provided in a form of an array, the light detection device further comprising a wall extending from a region between the plurality of the through holes toward a corresponding region of the optical sensor.

(10)

The light detection device according to (9), wherein, when the pinhole array is viewed from the front, the wall is disposed so as to partition the through hole into a polygonal shape.

(11)

The light detection device according to any one of (1) to (10), wherein the optical sensor is a photodiode array, the photodiode array including a plurality of photodiodes arranged to be separated from each other.

(12)

The light detection device according to any one of (1) to (11), wherein the through hole is provided in a transmissive display so as to be located in a light transmitting portion of the transmissive display.

(13)

The light detection device according to any one of (1) to (12), wherein the pinhole body is a stacked body.

(14)

The light detection device according to any one of (1) to (13), wherein the pinhole body has an inner side surface forming the through hole, and the inner side surface forming the through hole has a light absorbing surface.

(15)

The light detection device according to any one of (1) to (14), wherein the pinhole body has a back surface facing the optical sensor, and the back surface facing the optical sensor has a light absorbing surface.

(16)

The light detection device according to any one of (1) to (15), the light detection device being provided as an imaging device or a fingerprint detection device.

REFERENCE SIGNS LIST

1 LIGHT DETECTION DEVICE
10 PINHOLE BODY
11 SURFACE PORTION
12 BASE PORTION
20 OPTICAL SENSOR
30 WALL
40 TRANSMISSIVE DISPLAY
41 DISPLAY PIXEL REGION
42 WIRING REGION
43 LIGHT SHIELDING MEMBER
111 FRONT SURFACE (FIRST SURFACE)
112 BACK SURFACE
113 INNER SIDE SURFACE
114 OUTER SIDE SURFACE
121 FRONT SURFACE
122 BACK SURFACE (SECOND SURFACE)
123 INNER SIDE SURFACE
124 OUTER SIDE SURFACE
H THROUGH HOLE
H1 FIRST HOLE
H2 SECOND HOLE
O1 FIRST APERTURE
O2 SECOND APERTURE
PD PHOTODIODE
V ANGLE OF VIEW
VL ANGLE OF VIEW LINE

The invention claimed is:

1. A light detection device, comprising:

a pinhole body with a through hole, wherein the through hole includes:

a first hole that includes a first aperture; and a second hole that includes a second aperture, wherein an aperture area of the second hole increases in a depth direction of the second hole; and an optical sensor behind the pinhole body, wherein the optical sensor is configured to receive light through the through hole, the first aperture of the through hole is smaller than the second aperture of the through hole, the first aperture is in a first surface of the pinhole body, the first surface is on a light incident surface side of the pinhole body, the second aperture is in a second surface of the pinhole body, the second surface is opposite to the first surface.

2. The light detection device according to claim 1, wherein a depth of the second hole from the second surface is greater than a depth of the first hole from the first surface.

3. The light detection device according to claim 2, wherein the second hole has a size that does not hinder image formation through the first hole.

4. The light detection device according to claim 2, wherein the second hole has at least one cross-sectional shape selected from a funnel shape, a staircase shape, and a wedge shape, in a case where the second hole is viewed from a direction that intersects the depth direction of the second hole.

5. The light detection device according to claim 2, wherein the second aperture of the second hole has a polygonal shape.

6. The light detection device according to claim 2, wherein the pinhole body includes a plurality of through holes having mutually different aperture areas, and the plurality of through holes includes the through hole.

7. The light detection device according to claim 1, the pinhole body being provided as a pinhole array, the pinhole array including a plurality of the through holes provided in a form of an array, the light detection device further comprising a wall extending from a region between the plurality of the through holes toward a corresponding region of the optical sensor.

8. The light detection device according to claim 7, wherein, when the pinhole array is viewed from the front, the wall is disposed so as to partition the through hole into a polygonal shape.

9. The light detection device according to claim 1, wherein the optical sensor is a photodiode array, the photodiode array includes a plurality of photodiodes, and the plurality of photodiodes are spaced apart.

10. The light detection device according to claim 1, wherein the through hole is configured to be in a light transmitting portion of a transmissive display.

11. The light detection device according to claim 1, wherein the pinhole body is a stacked body.

12. The light detection device according to claim 1, wherein the pinhole body has an inner side surface in the through hole, and the inner side surface in the through hole has a light absorbing surface.

13. The light detection device according to claim 1, wherein the pinhole body has a back surface that faces the optical sensor, and the back surface that faces the optical sensor has a light absorbing surface.

14. The light detection device according to claim 1, wherein the light detection device is one of an imaging device or a fingerprint detection device.

* * * * *